(12) United States Patent
Liu et al.

(10) Patent No.: US 12,513,979 B2
(45) Date of Patent: Dec. 30, 2025

(54) SEMICONDUCTOR DEVICE

(71) Applicant: Taiwan Semiconductor Manufacturing Company, Ltd., Hsinchu (TW)

(72) Inventors: Ko-Cheng Liu, Hsinchu (TW); Chang-Miao Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 654 days.

(21) Appl. No.: 17/568,980

(22) Filed: Jan. 5, 2022

(65) Prior Publication Data

US 2023/0170349 A1    Jun. 1, 2023

Related U.S. Application Data

(60) Provisional application No. 63/279,337, filed on Nov. 15, 2021.

(51) Int. Cl.
*H10D 84/83* (2025.01)
*H10D 62/10* (2025.01)
*H10D 84/01* (2025.01)

(52) U.S. Cl.
CPC ......... *H10D 84/832* (2025.01); *H10D 62/121* (2025.01); *H10D 84/0151* (2025.01); *H10D 84/83* (2025.01); *H10D 84/83138* (2025.01)

(58) Field of Classification Search
CPC ........... H01L 29/42392; H01L 29/0673; H01L 27/088; H01L 27/0886; H10D 84/832; H10D 84/83; H10D 84/834; H10D 84/83138; H10D 84/0151
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2014/0306317 A1* | 10/2014 | Licausi | H01L 27/0886 257/506 |
| 2020/0258745 A1* | 8/2020 | Xu | H01L 27/0886 |

(Continued)

*Primary Examiner* — Peter M Albrecht
(74) *Attorney, Agent, or Firm* — Birch, Stewart, Kolasch & Birch, LLP

(57) ABSTRACT

A semiconductor device includes: a first transistor including a first gate structure; a second transistor including a second gate structure and arranged adjacent to the first transistor in a first direction; and a first isolation feature extending in a second direction. The second direction and the first direction are perpendicular. The first isolation feature is between the first gate structure and the second gate structure and in contact with the first gate structure and the second gate structure. The semiconductor structure further includes a first connection structure under the first isolation feature. The first connection structure connects the first gate structure to the second gate structure.

20 Claims, 22 Drawing Sheets

(56) References Cited

U.S. PATENT DOCUMENTS

2020/0258785 A1* 8/2020 Zhang .................. H01L 27/088
2021/0305361 A1* 9/2021 Pranatharthi Haran .....................
                                                          H01L 29/068
2022/0173097 A1* 6/2022 Yang .................. H01L 27/0886

* cited by examiner

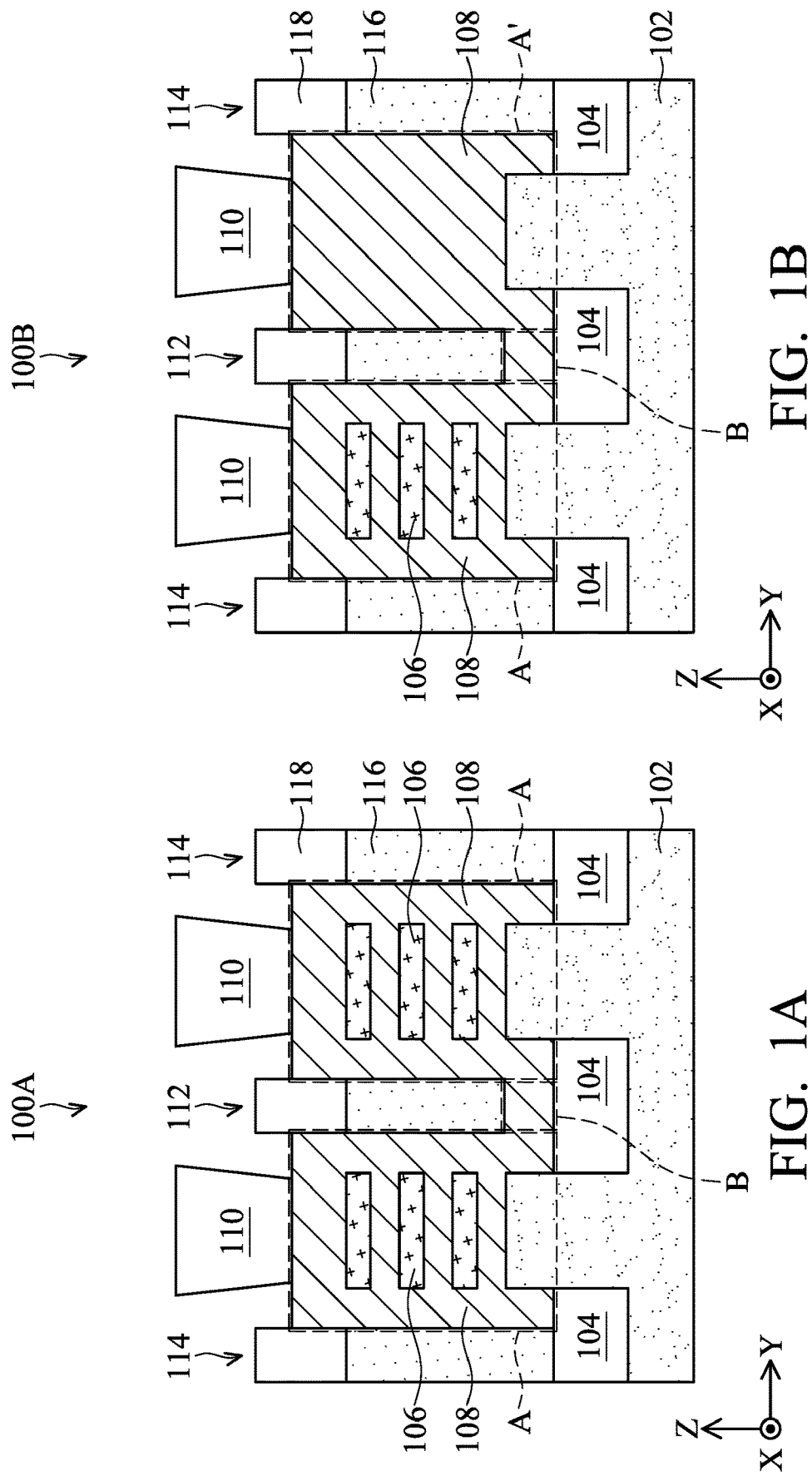

SEMICONDUCTOR DEVICE

PRIORITY CLAIM AND CROSS-REFERENCE

This application claims the benefit of U.S. Provisional Application No. 63/279,337, filed Nov. 15, 2021, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) devices have been incorporated into memory devices (including, for example, static random-access memory, or SRAM, cells) and core devices (including, for example, standard logic, or STD, cells) to reduce chip footprint while maintaining reasonable processing margins. Gate resistance extraction of GAA device is important for device operation speed design of RC time delay. However, as GAA devices continue to be scaled down, conventional methods for extracting a gate resistance of GAA devices may experience challenges. Accordingly, although existing technologies for extracting the gate resistance of the GAA device have been generally adequate for their intended purposes, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B are cross sectional views of embodiments of semiconductor devices of the present disclosure, in accordance with some embodiments.

DETAILED DESCRIPTION

Figure 2A:
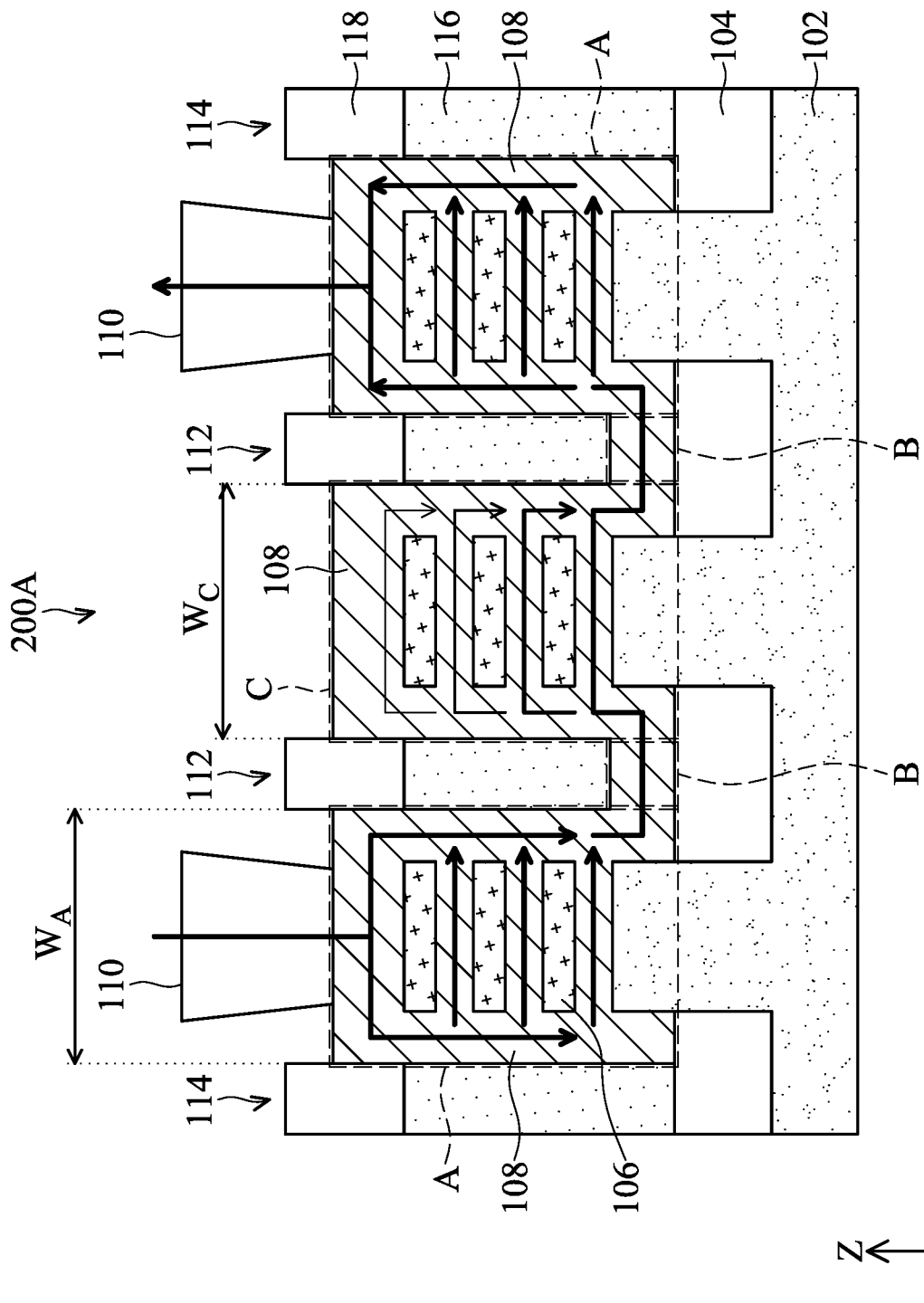
FIG. 2A is cross sectional views of an embodiment of a semiconductor device including three GAA structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to field-effect transistors (FETs), such as three-dimensional gate-all-around (GAA) FETs, in an integrated circuit (IC) structure. Generally, a GAA FET may include a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures including a connection structure under isolation feature to connect one gate structure to another gate structure. The details of the structure and fabrication methods of the present disclosure are described below in conjunction with the accompanying drawings, which illustrate the process of making GAA devices, according to some embodiments.

In order to calculate resistive-capacitive (RC) time delay for device operation speed design, precise gate resistance extraction is important. In conventional method for extracting a gate resistance of GAA devices, structures with multiple GAA structures connected together are used. However, these GAA structures are connected by connecting top portions of gate structures together, which causes most of the current flowing through the top portions of gate structures when measuring resistance. The gate resistance extracted by such way is imprecise because less current flow through portions of the gate structure between nanosheets of the GAA structures due to higher resistance of these portions. Improved structures for extracting the gate resistance are needed.

FIGS. 1A and 1B are cross sectional views of embodiments of semiconductor devices 100A and 100B of the present disclosure, in accordance with some embodiments. FIGS. 1A and 1B show semiconductor devices 100A and 100B over a semiconductor substrate 102 and an isolation feature 104 in the semiconductor substrate 102. The semiconductor device 100A has two GAA transistors (or GAA devices or structures) A, and the semiconductor device 100B has a GAA transistors (or GAA devices or structures) A and a transistor A'.

The GAA transistors A of the semiconductor devices 100A and 100B each have semiconductor layers 106 stacked in a Z-direction and a gate structure 108 wrapping around the semiconductor layers 106, and the transistor A' of the semiconductor device 100B has a portion of the semiconductor substrate 102 and a gate structure 108. Gate contacts 110 are over and connected to the gate structures 108 of the GAA transistors A and the transistor A'.

As shown in the semiconductor device 100A, the GAA transistors A are arranged in a Y-direction and an isolation feature 112 is between the GAA transistors A. In some embodiments, the isolation feature 112 is in contact with the gate structures 108 of the GAA transistors A. Similarly, as shown in the semiconductor device 100B, an isolation feature 112 is between the GAA transistor A and the transistor A'. Further, in some embodiments, the isolation feature 112 is in contact with the gate structures 108 of the GAA transistor A and the transistor A'. Each Isolation features 114 is adjacent to a GAA transistor A or a transistor A'. In some embodiments, the isolation features 114 contact the top surface of the isolation structure 104. The isolation features 114 are disposed at ends of the semiconductor devices 100A and 100B as boundaries to separate the semiconductor devices 100A and 100B from other devices (not shown). The isolation features 112 and 114 each have a first isolation material 116 and a second isolation material 118.

In the semiconductor device 100A, a connection structure B is under the isolation feature 112 to separate the isolation feature 112 from the isolation structure 104. As shown in FIG. 1A, the connection structure B connect the gate structure 108 of one GAA transistor A to the gate structure 108 of another GAA transistor A. Similarly, in semiconductor device 100B, a connection structure B is under the isolation feature 112 to separate the isolation feature 112 from the isolation structure 104. As shown in FIG. 1B, the connection structure B connect the gate structure 108 of the GAA transistor A to the gate structure 108 of the transistor A'. It should be noted that the connection structures B and the gate structures 108 are formed in the same fabrication process, and there are no real interfaces between the connection structures B and the gate structures 108.

As discussed above, the gate resistance of the GAA extracted through the structures with multiple GAA structures connected together by connecting top portions of gate structures is imprecise. The connection structures B of the semiconductor devices 100A and 100B cause the measurement current to flow through portions of the gate structure 108 between the semiconductor layers 106 in the GAA transistor A during resistance measurement. Therefore, the gate resistance of the single GAA transistor A may be precisely extracted. Specifically, by extracting resistances of the semiconductor devices 100A and 100B, the gate resistance of the single GAA transistor A may be obtained. For example, the total resistance $2R_A+R_B$ of the two GAA transistors A and the connection structure B of the semiconductor device 100A may be measured through the gate contacts 110 of the semiconductor device 100A, in which $R_A$ is the resistance of the GAA transistor A and $R_B$ is the resistance of the connection structure B. In the same way, the total resistance $R_A+R_B$ of the GAA transistor A and the connection structure B of the semiconductor device 100B may be measured through the gate contacts 110 of the semiconductor device 100B. It should be noted that the resistance of the transistor A' may be omitted because the resistance of the transistor A' is very small due to large cross-sectional area of the gate structure 108 of the transistor A'. After obtaining the total resistances $2R_A+R_B$ and $R_A+R_B$, the gate resistance of the single GAA transistor A may be extracted by subtracting $R_A+R_B$ from $2R_A+R_B$ (i.e., $R_A=(2R_A+R_B)-(R_A+R_B)$). Therefore, the gate resistance $R_A$ of the single GAA transistor A is precisely extracted.

Figure 2B:
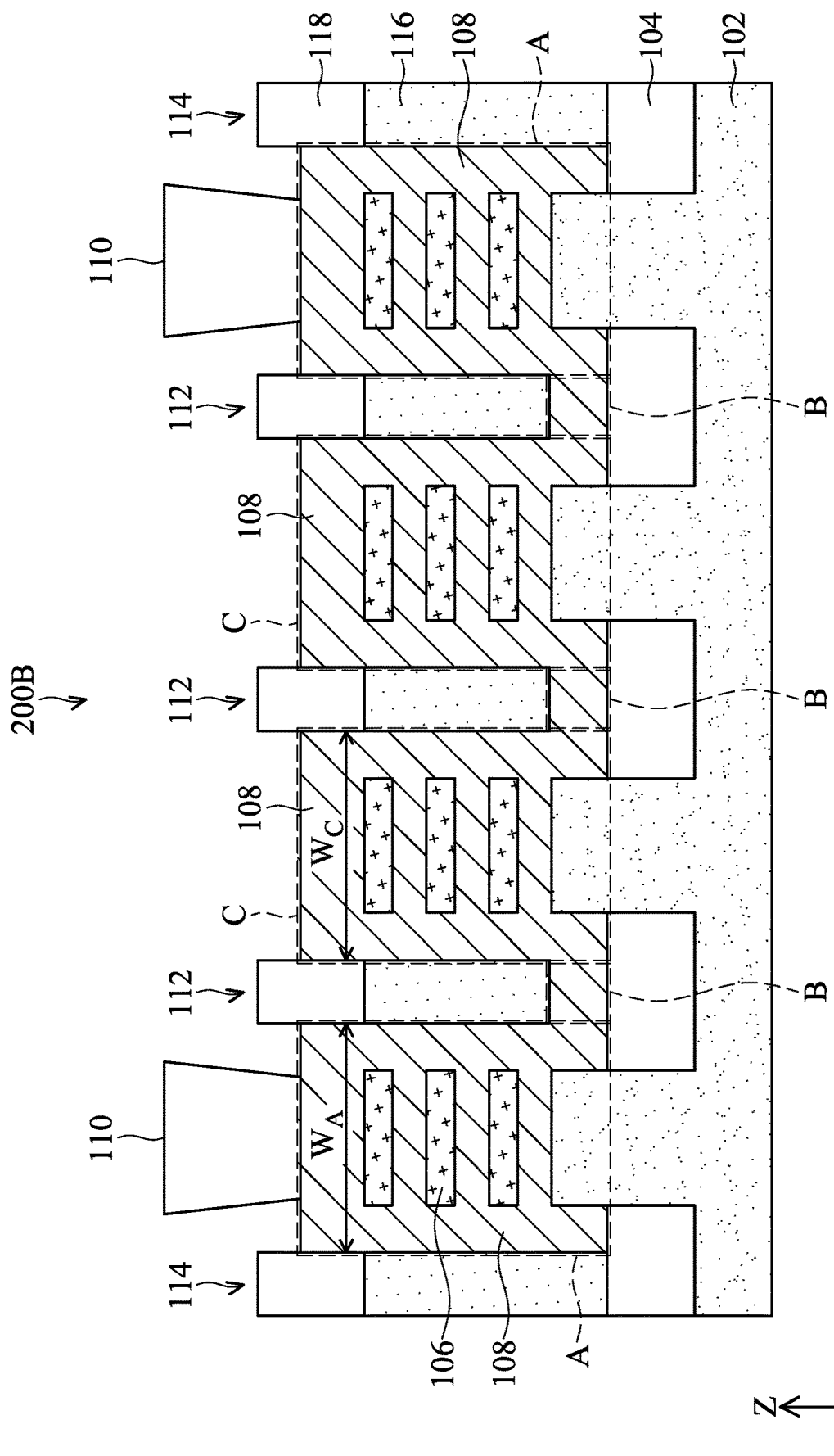
FIG. 2B is cross sectional views of an embodiment of a semiconductor device including four GAA structures, in accordance with some embodiments.
Figure 2C:
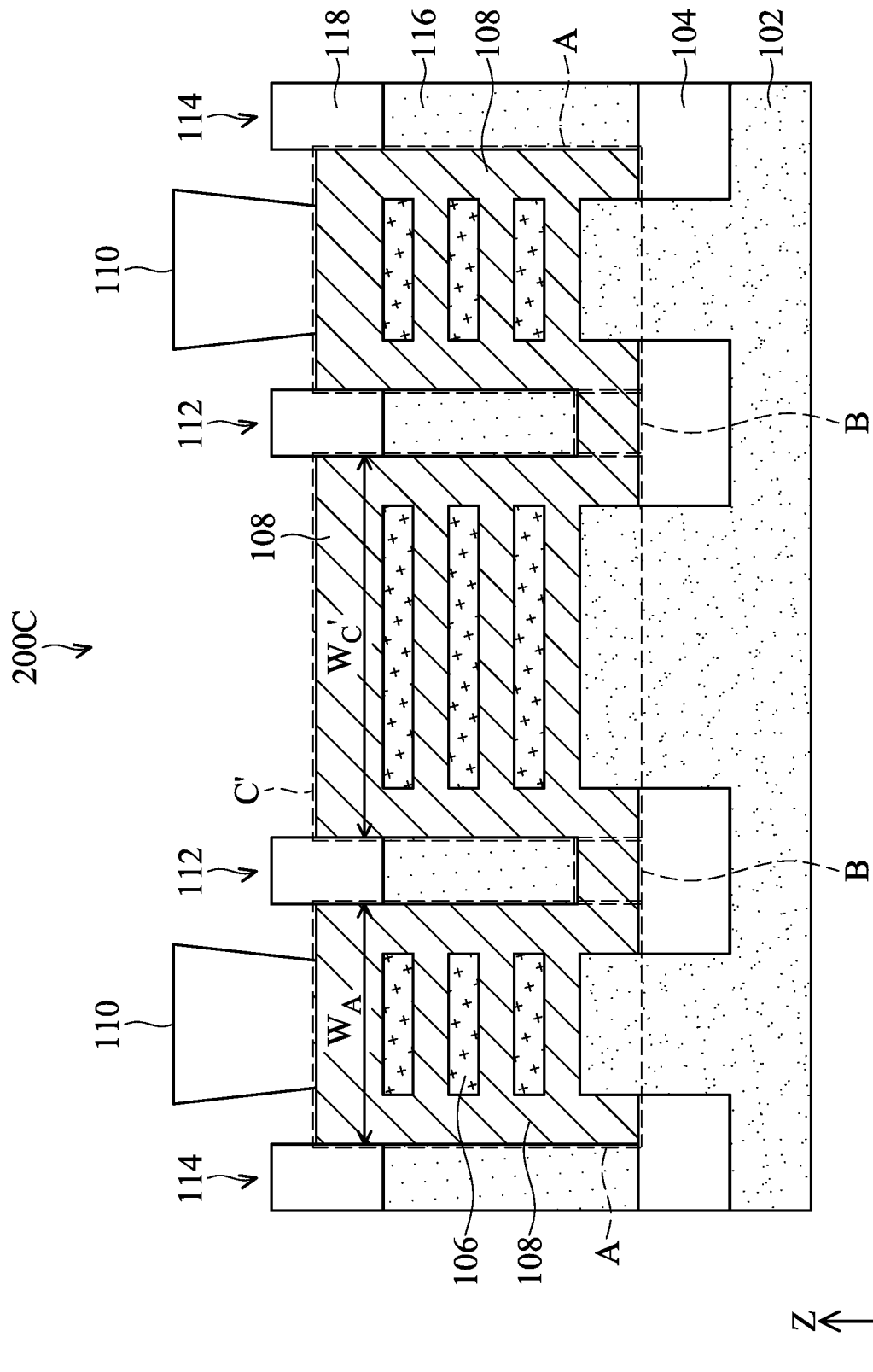
FIG. 2C is cross sectional views of an embodiment of a semiconductor device including three GAA structures, in accordance with some embodiments.

FIGS. 2A to 2C are cross sectional views of semiconductor devices 200A to 200C for another method of extracting the resistance of the GAA transistor, in accordance with some embodiments. The semiconductor devices 200A includes similar features as the semiconductor devices 100A and 100B. These similarities and differences are described in more detail below.

The semiconductor devices 200A is over the semiconductor substrate 102 and the isolation feature 104 in the semiconductor substrate 102. As shown in FIG. 2A, the semiconductor device 200A includes two GAA transistors A and a GAA transistor C. The GAA transistor C is between the two GAA transistors A. The GAA transistors A and C each have semiconductor layers 106 stacked in the Z-direction and a gate structure 108 wrapping around the semiconductor layers 106. In some embodiments, the gate width $W_A$ of the gate structure 108 of the GAA transistor A is different than the gate width $W_C$ of the gate structure 108 of the GAA transistor C. In this case, along the Y-direction, the width of the semiconductor layers 106 of the GAA transistor A may also be different than a width of the semiconductor layers 106 of the GAA transistor C. In other embodiments, the gate width $W_A$ of the gate structure 108 of the GAA transistor A and the gate width $W_C$ of the gate structure 108 of the GAA transistor C are the same. In this case, along the Y-direction, the widths of the semiconductor layers 106 of the GAA transistor A and C are the same. It should be noted that gate contacts 110 are over and connected to the gate structures 108 of the GAA transistors A for measuring resistance, while no any gate contacts 110 are over and connected to the GAA transistor C.

As shown in the semiconductor device 200A, isolation features 112 are between the GAA transistors A and C. In some embodiments, the isolation feature 112 is in contact with the gate structures 108 of the GAA transistors A and C. Each Isolation features 114 is adjacent to a GAA transistor A. In some embodiments, the isolation features 114 contact the top surface of the isolation feature 104. The isolation features 114 are disposed at ends of the semiconductor device 200A as boundaries to separate the semiconductor device 200A from other devices (not shown). The isolation features 112 and 114 each have the first isolation material 116 and the second isolation material 118.

Each of the connection structures B is under the isolation feature 112 to separate the isolation feature 112 from the isolation structure 104. As shown in FIG. 2A, the connection structures B connect the gate structure 108 of the GAA transistors A and C. As discussed above, the connection structures B of the semiconductor device 200A cause the measurement current to flow through portions of the gate structure 108 between the semiconductor layers 106 in the GAA transistors A during the resistance measurement. Specifically, as arrows (represent directions of the measurement current) shown in FIG. 2A, the current may goodly flow through the portions of the gate structure 108 between the semiconductor layers 106 in the GAA transistors A. It can be seen that the current is not uniform in the GAA transistor C, but since the gate resistance of the GAA transistor C will be eliminated at the result of the resistance calculation, such non-uniformity does not affect the extracting for the gate resistance of the single GAA transistor A.

As shown in FIG. 2B, the semiconductor devices 200B is over the semiconductor substrate 102 and the isolation feature 104 in the semiconductor substrate 102. The features of the semiconductor devices 200B are similar to that of the semiconductor devices 200A, except that the semiconductor devices 200B further includes an additional GAA transistor C, an additional isolation feature 112, and an additional connection structure B. The GAA transistors C are between the two GAA transistors A. It should be noted that gate contacts 110 are over and connected to the gate structures 108 of the GAA transistors A for measuring resistance, while no any gate contacts 110 are over and connected to the GAA transistors C.

As shown in the semiconductor device 200B, isolation features 112 are between the GAA transistors A and C. In some embodiments, the isolation features 112 is in contact with the gate structures 108 of the GAA transistors A or C. Each isolation features 114 is adjacent to one of the GAA transistors A. In some embodiments, the isolation features 114 contact the top surface of the isolation feature 104. The isolation features 114 are disposed at ends of the semiconductor device 200A as boundaries to separate the semiconductor device 200B from other devices (not shown).

Each connection structures B is under the isolation feature 112 to separate the isolation feature 112 from the isolation structure 104. As shown in FIG. 2B, the connection structures B connect the gate structure 108 of the GAA transistors A and C. As discussed above, the connection structures B of the semiconductor device 200B cause the measurement current to flow through portions of the gate structure 108 between the semiconductor layers 106 in the GAA transistors A during the resistance measurement.

As shown in FIG. 2C, the semiconductor devices 200C is over the semiconductor substrate 102 and the isolation feature 104 in the semiconductor substrate 102. The features of the semiconductor devices 200C are similar to that of the semiconductor devices 200A, except that the semiconductor devices 200C includes two GAA transistors A and a GAA transistor C', in which the gate width $W_{C'}$ of the GAA transistor C' is different than the gate width $W_C$ of the GAA transistor C. The GAA transistor C' is between the two GAA transistors A.

In order to extracting the gate resistance of the single GAA transistor A, it should be noted that the gate width $W_{C'}$ of the gate structure 108 of the GAA transistor C' in the semiconductor device 200C is designed that different than the gate width $W_C$ of the gate structure 108 of the GAA transistor C in the semiconductor device 200A. More specifically, the gate width $W_{C'}$ is designed into a multiple of the gate width $W_C$. For example, gate width $W_{C'}$ is twice as wide as gate width $W_C$ (i.e., $W_{C'}=2\times W_C$).

Similarly, by extracting resistances of the semiconductor devices 200A to 200C, the gate resistance of the single GAA transistor A may be obtained. Specifically, by performing the resistance measurement through the gate contacts 110 of the semiconductor devices 200A to 200C, it may extract the total resistance $2R_A+2R_B+R_C$ of the semiconductor device 200A, the total resistance $2R_A+3R_B+2R_C$ of the semiconductor device 200B, and the total resistance $2R_A+2R_B+R_{C'}$ of the semiconductor device 200C, in which $R_A$ is the resistance of the GAA transistor A, $R_B$ is the resistance of the connection structure B, $R_C$ is the resistance of the GAA transistor C, and $R_{C'}$ is the resistance of the GAA transistor C'.

As discussed above, the gate width $W_{C'}$ of the gate structure 108 of the GAA transistor C is designed into a multiple of the gate width $W_C$ of the gate structure 108 of the GAA transistor C in the semiconductor device 200A. For the purpose of simplicity and convenience, the gate width $W_{C'}$ of the gate structure 108 of the GAA transistor C' in the semiconductor devices 200C is designed to be twice as wide as the gate width $W_C$ of the gate structure 108 of the GAA transistor C in the semiconductor device 200A, and the gate lengths of the GAA transistors A and C (not shown) in the X-direction are designed to be the same, so that $R_{C'}$ (the resistance of the GAA transistor C') is twice as high as $R_C$ (the resistance of the GAA transistor C) herein, i.e., $R_{C'}=2\times R_C$. Therefore, the total resistance $2R_A+2R_B+R_{C'}$ of the semiconductor device 200C may become the total resistance $2R_A+2R_B+2R_C$. After obtaining the total resistances $2R_A+2R_B+R_C$, $2R_A+3R_B+2R_C$, and $2R_A+2R_B+2R_C$, the gate resistance of the single GAA transistor A may be precisely extracted by calculation.

As discussed above, the gate resistance of the single GAA transistor A may be precisely extracted with the semiconductor devices 200A to 200C. In some embodiments, more different semiconductor devices similar to the semiconductor device 200B may be formed together for extracting the gate resistance of the single GAA transistor A. Specifically, semiconductor devices may have more additional GAA transistors C, additional isolation features 112, and additional connection structures B. For example, a semiconductor device with one more GAA transistors C, one more isolation features 112, and one more connection structures B than the semiconductor device 200B may be formed, so that the total resistance $2R_A+4R_B+3R_C$ of such a semiconductor device may be measured for above extraction and calculation.

Similarly, in some embodiments, more different semiconductor devices similar to the semiconductor device 200C may be formed together for extracting the gate resistance of the single GAA transistor A. Specifically, a semiconductor device may have an GAA transistor between the GAA transistors A, in which the GAA transistor may have a gate width that is a multiple of the gate width $W_C$ and different than the gate width $W_{C'}$. For example, if gate width $W_{C'}$ is designed to be twice as wide as gate width $W_C$, the GAA transistor may be designed to be three times, four times, or more as much as the gate width $W_C$, so that the total resistance $2R_A+2R_B+3R_C$, or $2R_A+2R_B+4R_C$, etc. of such a semiconductor device may be measured for above extraction and calculation.

Figure 3:
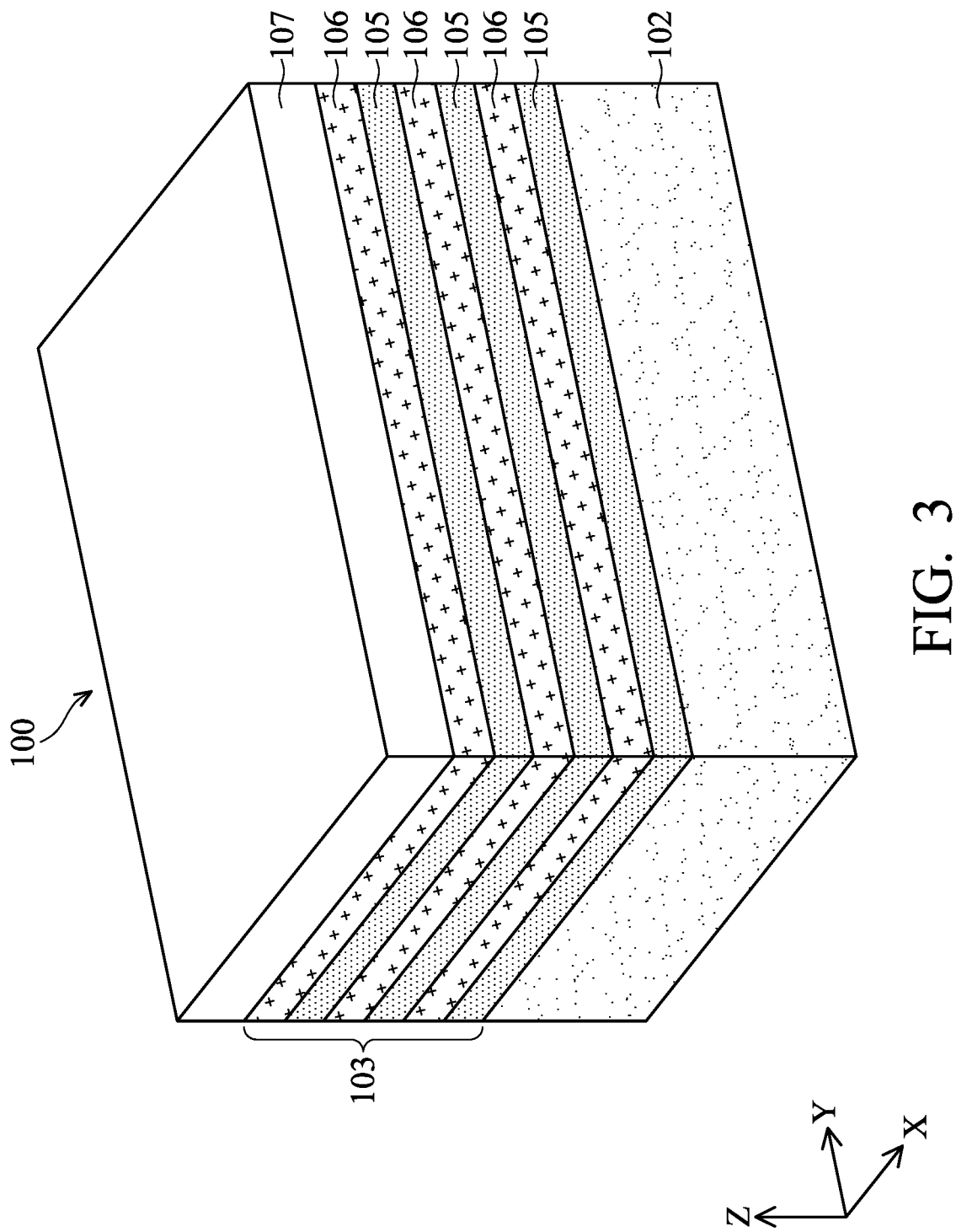
FIGS. 3 and 4 are isometric views of an embodiment of a workpiece of the present disclosure constructed at various fabrication stages, in accordance with some embodiments.
Figure 4:
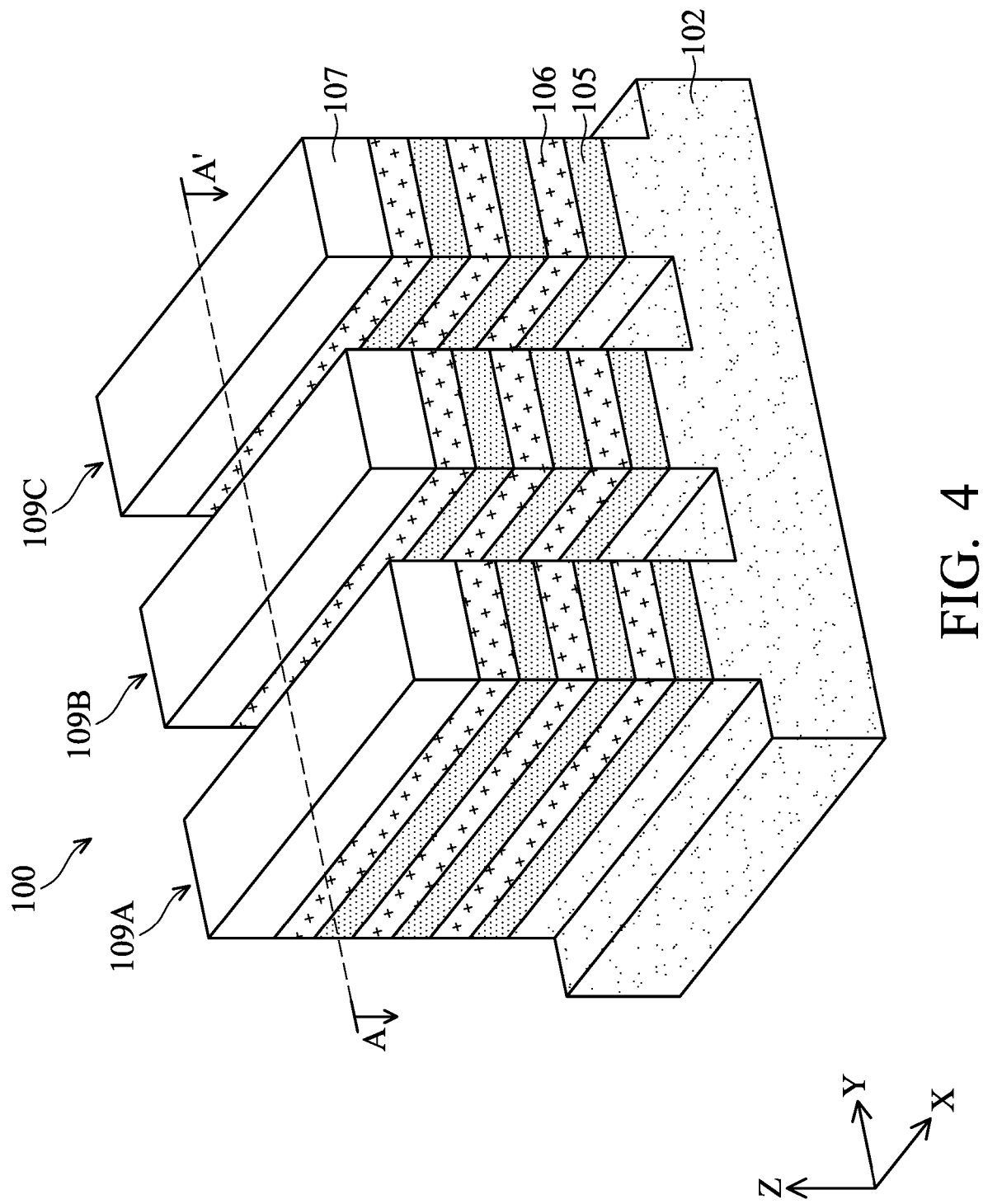

FIGS. 3 and 4 illustrate isometric views of a workpiece 100 constructed at various fabrication stages. FIGS. 5 to 18 illustrate cross sectional views of the workpiece 100 constructed at various fabrication stages along a line A-A' of FIG. 4, in accordance with some embodiments. The workpiece 100 will be formed into the above semiconductor devices. For the purpose of simplicity and convenience, the workpiece 100 will be formed as a structure similar to the above semiconductor device 200A herein. It can be appreciated that any of the above semiconductor devices may be formed by slightly changing the subsequent processes, as discussed in greater detail below.

Referring to FIG. 3, a workpiece 100 is provided. The workpiece 100 includes a semiconductor substrate 102 and a stack 103 over the semiconductor substrate 102. In some embodiments, the semiconductor substrate 102 contains a semiconductor material, such as bulk silicon (Si). In some other embodiments, the semiconductor substrate 102 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The semiconductor substrate 102 may also include an insulating layer, such as a silicon oxide layer, to have a silicon-on-insulator (SOI) structure or a germanium-on-insulator (GOI) structure. In some embodiments, the semiconductor substrate 102 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion. In some embodiments, n-type wells have an n-type dopant concentration of about $5\times10^{16}$ cm$^{-3}$ to about $5\times10^{19}$ cm$^{-3}$, and p-type wells have a p-type dopant concentration of about $5\times10^{16}$ cm$^{-3}$ to about $5\times10^{19}$ cm$^{-3}$.

The stack 103 includes semiconductor layers 105 and 106, and the semiconductor layers 105 and 106 are alternating stacked in the Z-direction. In some embodiments, the stack 103 has a thickness in a range from about 50 nm to about 60 nm. In other embodiments, the semiconductor layers 106 each have a thickness in a range from about 4 nm to about 8 nm. The semiconductor layers 105 and the semiconductor layers 106 may have different semiconductor compositions. In some embodiments, semiconductor layers 105 are formed of silicon germanium (SiGe) and the semiconductor layers 106 are formed of silicon (Si). In these embodiments, the additional germanium content in the semiconductor layers 105 allow selective removal or recess of the semiconductor layers 105 without substantial damages to the semiconductor layers 106, so that the semiconductor layers 105 are also referred to as sacrificial layers. In some embodiments, the semiconductor layers 105 and 106 are epitaxially grown over (on) the semiconductor substrate 102 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized. The semiconductor layers 105 and the semiconductor layers 106 are deposited alternatingly, one-after-another, to form the stack 103. It should be noted that three (3) layers of the semiconductor layers 105 and three (3) layers of the semiconductor layers 106 are alternately and vertically arranged (or stacked) as shown in FIG. 3, which are for illustrative purposes only and not intended to be limiting beyond what is specifically recited in the claims. The number of layers depends on the desired number of channels members for the semiconductor device. In some embodiments, there may be from 2 to 10 semiconductor layers 105 alternating with 2 to 10 semiconductor layers 106 in the stack 103.

For patterning purposes, the workpiece 100 may also include a hard mask layer 104 over the stack 104. The hard mask layer 107 may be a single layer or a multilayer. In some embodiments, the hard mask layer 107 is a single layer and includes a silicon germanium layer. In some embodiments, the hard mask layer 107 is a multi-layer and includes a silicon nitride layer and a silicon oxide layer over the silicon nitride layer. In some other embodiments, the hard mask layer 107 is a multi-layer and includes a silicon germanium layer and a silicon layer over the silicon germanium layer.

Referring to FIG. 4, the semiconductor substrate 102, the stack 103 and the hard mask layer 107 are then patterned to form fins 109A, 109B, and 109C (may be collectively referred to as fins 109) over the semiconductor substrate 102. As shown in FIG. 4, each of the fins 109 includes a base portion formed from a portion of the semiconductor substrate 102 and a stack portion formed from the stack 103 over the base portion. The fins 109 each extend lengthwise in the X-direction and extend vertically in the Z-direction over the semiconductor substrate 102. In some embodiments, widths of the fins 109A, 109B, and 109C along the Y-direction are the same. In some embodiments, the widths of the fins 109A, 109B, and 109C are in a range from about 20 nm to about 30 nm. In some embodiments, the height of the fins 109A, 109B, and 109C are in a range from about 60 nm to about 70 nm. In other embodiments, the width of the fin 109A and the width of the fin 109C are the same, and the width of the fin 109B is different than the widths of the fins 109A and 109C. For example, the width of the fin 109B may be larger than the widths of the fins 109A and 109C to form the structure as the semiconductor device 200C above. Although the three fins 109A, 109B, and 109C are formed herein, more fins may be formed, such as four fins to the structure as the semiconductor device 200B above.

The fins 109 may be patterned using suitable processes including double-patterning or multi-patterning processes. For example, in some embodiment, a material layer is formed over a substrate and patterned using a photolithography process. Spacers are formed alongside the patterned material layer using a self-aligned process. The material layer is then removed, and the remaining spacers, or mandrels, may then be used to pattern the fins 109 by etching the stack 103 and the semiconductor substrate 102. The etching process may include dry etching, wet etching, reactive ion etching (RIE), and/or other suitable processes.

Figure 5:
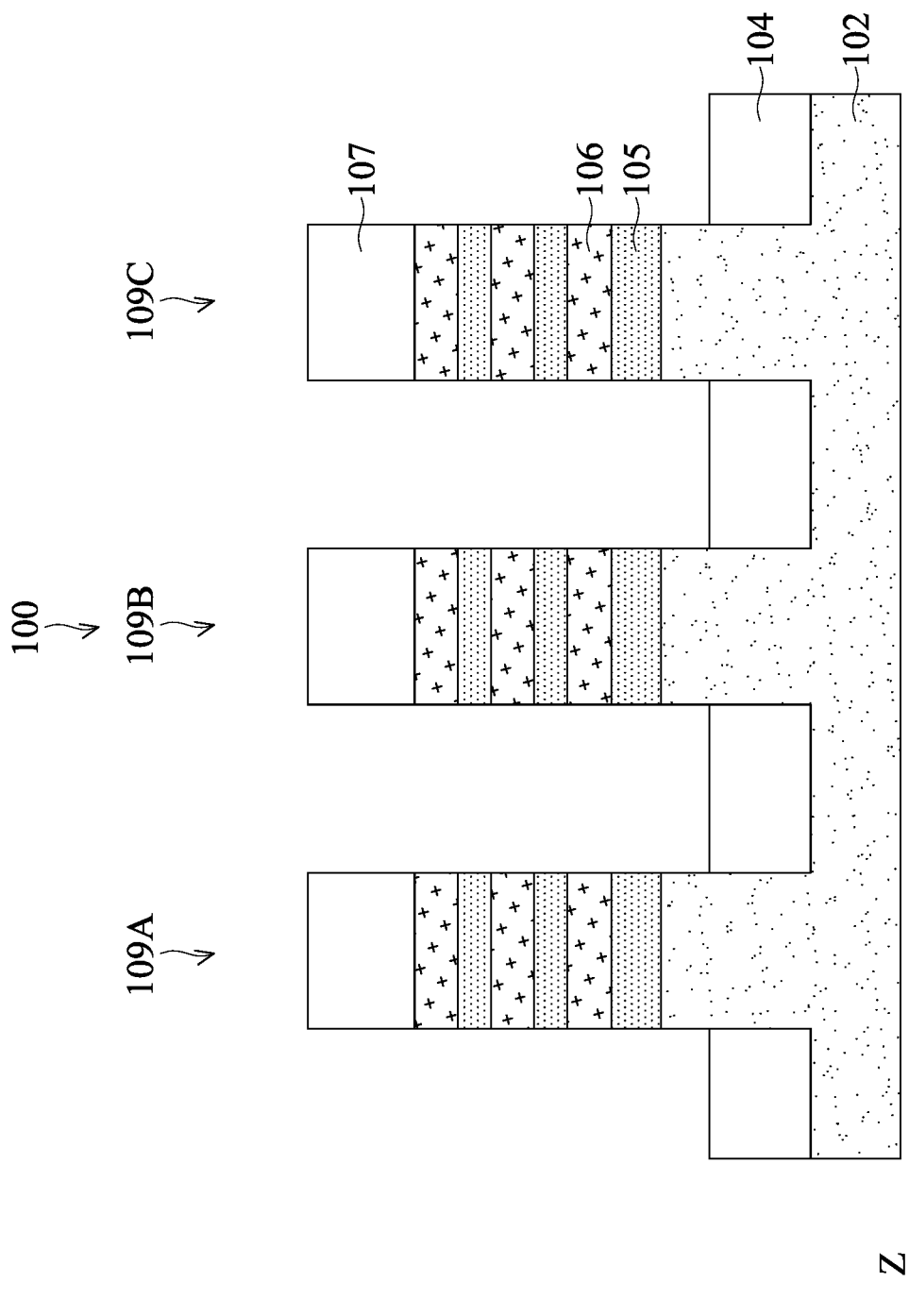
FIGS. 5, 6, 7, 8, 9, 10, 11, 12, 13, 14A, 15, 16, 17, and 18 are cross sectional views of an embodiment of a workpiece of the present disclosure constructed at various fabrication stages along line A-A', in accordance with some embodiments.

Referring to FIG. 5, the isolation structure 104 is formed. After the fins 109 are formed, the isolation structure 104 is formed between neighboring fins 109. In some aspects, the isolation structure 104 extending in the X-direction and arranged with the fins 109 in the Y-direction. In some other aspects, the isolation structure 104 is formed around the fins 109. The isolation structure 104 may also be referred to as shallow trench isolation (STI) feature. In some embodiments, a dielectric material for the isolation structure 104 is first deposited over the workpiece 100, filling the trenches between fins 109 with the dielectric material. In some embodiments, the dielectric material may include silicon oxide, silicon nitride, silicon oxynitride, fluorine-doped silicate glass (FSG), a low-k dielectric, combinations thereof, and/or other suitable materials. In various embodiments, the dielectric material may be deposited by a CVD process, a subatmospheric CVD (SACVD) process, a flowable CVD (FCVD) process, an ALD process, spin-on coating, and/or other suitable process. The deposited dielectric material is then thinned and planarized, for example by a chemical mechanical polishing (CMP) process, until top surfaces of the hard mask layer 107 is exposed (not shown). Referring then to FIG. 5, the planarized dielectric material is further recessed by a dry etching process, a wet etching process, and/or a combination thereof to form the isolation structure 104. As shown in FIG. 5, the stack portions of the fins 109 rise above the isolation structure 104 while the base portions are surrounded by the isolation structure 104. In other words, the top surface of the semiconductor substrate 102 is higher than the top surface of the isolation structure 104. In some embodiments, the top surface of the stack 103 (or the topmost surface of the semiconductor layers 106) is separated from the top surface of the isolation structure 104 by about 60 nm to about 70 nm.

Figure 6:
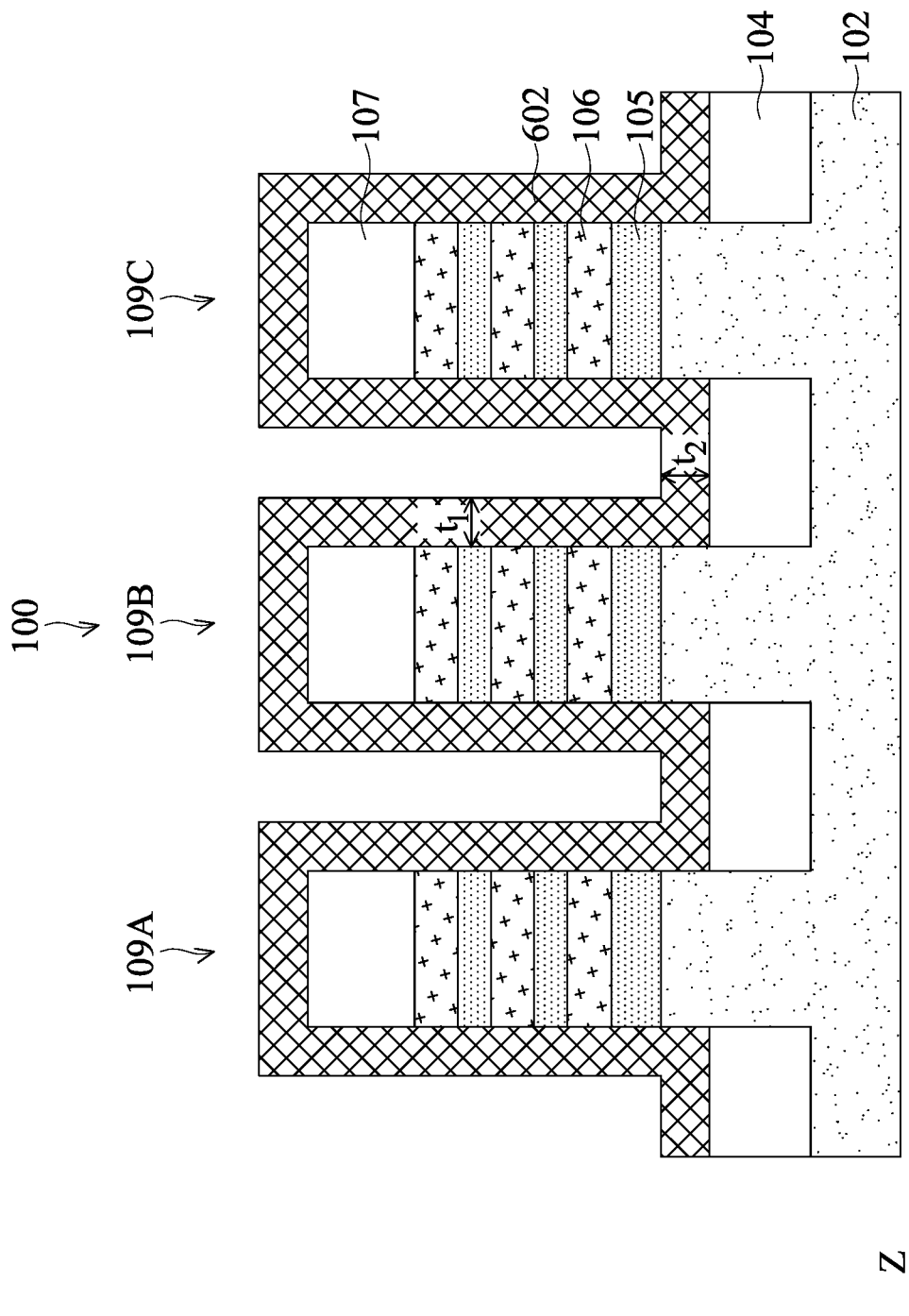

Referring to FIG. 6, a cladding layer 602 is formed on sidewalls of the fins 109 and sidewalls of the hard mask layer 107, and formed over the isolation structure 104 and the hard mask layer 107. In some embodiments, the cladding layer 602 may have a composition similar to that of the semiconductor layers 105. In some embodiments, the cladding layer 602 may be formed of silicon germanium (SiGe), just like the semiconductor layers 105. This common composition allows selective removal of the semiconductor layers 105 and the cladding layer 602 in a subsequent process (e.g., release process). In some embodiments, the formation of the cladding layer 602 may include conformally grow cladding material. In some embodiments, the cladding layer 602 may be deposited using CVD, ALD, or other suitable deposition method. In some embodiments, a thickness $t_1$ of sidewalls of the cladding layer 602 along the Y-direction is in a range from about 8 nm to about 15 nm. In some embodiments, a thickness $t_2$ of the cladding layer 602 along the Z-direction is in a range from about 10 nm to about 20 nm.

Figure 7:
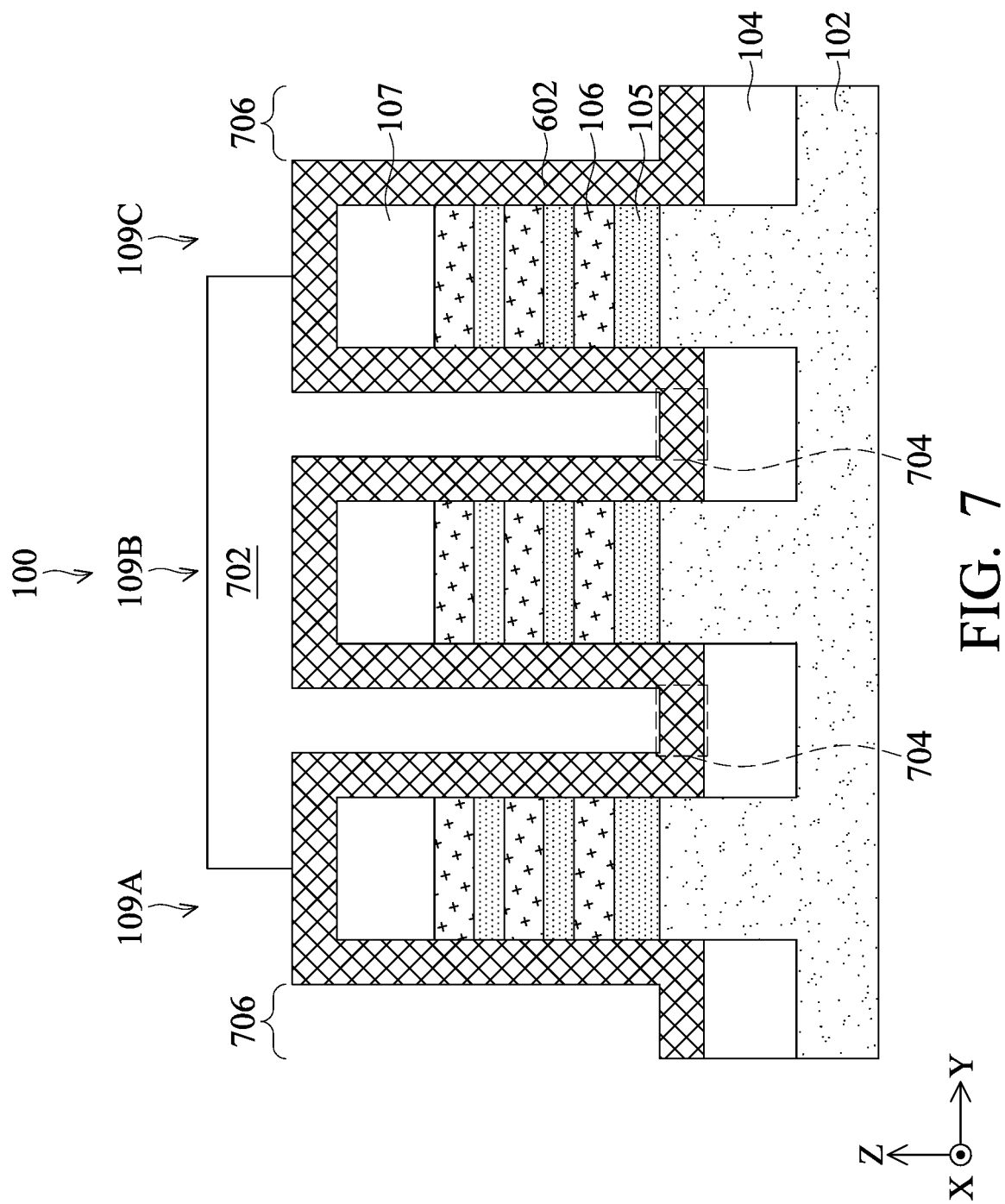

Referring to FIG. 7, after the cladding layer 602 is deposited, a photoresist layer (resist) 702 is formed as a mask layer and over a portion of the cladding layer 602. Specifically, the photoresist layer 702 cover the fin 109B and portions of the fins 109A and 109C and fill trenches between the fins 109. It should be noted that the photoresist layer 702 define regions 704 to be formed for connection structures B and end regions 706 to be formed for the isolation features 114 as boundaries of the resultant structure. It also noted that the photoresist layer 702 exposes portions of the cladding layer 602 over the fins 109A and 109C. More specifically, sidewalls of the photoresist layer 702 do not need to be aligned with sidewalls of the cladding layer 602 on the fins 109A and 109C. Therefore, the formation of the photoresist layer 702 has large processing margin.

Figure 8:
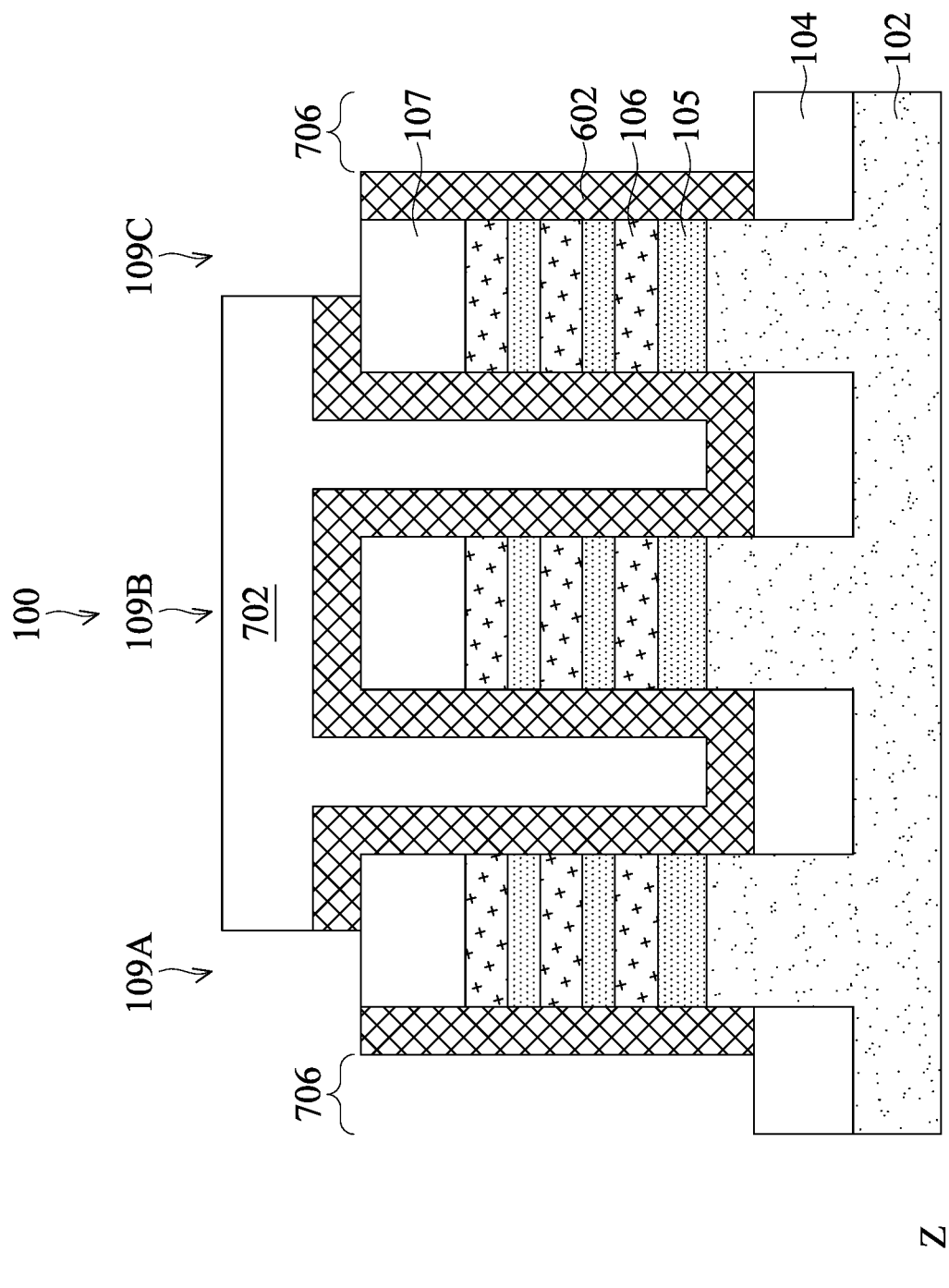

Referring to FIG. 8, an etch process is performed to remove portions of the cladding layer 602 on the top surfaces of the hard mask layer 107 over the fins 109A and 109C uncovered by the photoresist layer 702, and remove portions of the cladding layer 602 on the top surfaces of the isolation structure 104 and in the end regions 706 uncovered by the photoresist layer 702, so that the cladding layer 602 remains on the sidewalls of the fins 112 and the sidewalls of the hard mask layer 107. The etch process may be a isotropic etch process, such as a dry etch process that includes use of plasma of hydrogen bromide (HBr), oxygen ($O_2$), chlorine ($Cl_2$), or mixtures thereof. As shown in FIG. 8, portions of the top surfaces of the hard mask layer 107 over the fins 109A and 109C are exposed and the top surfaces of the isolation structure 104 in the end regions 706 after the etch process.

Figure 9:
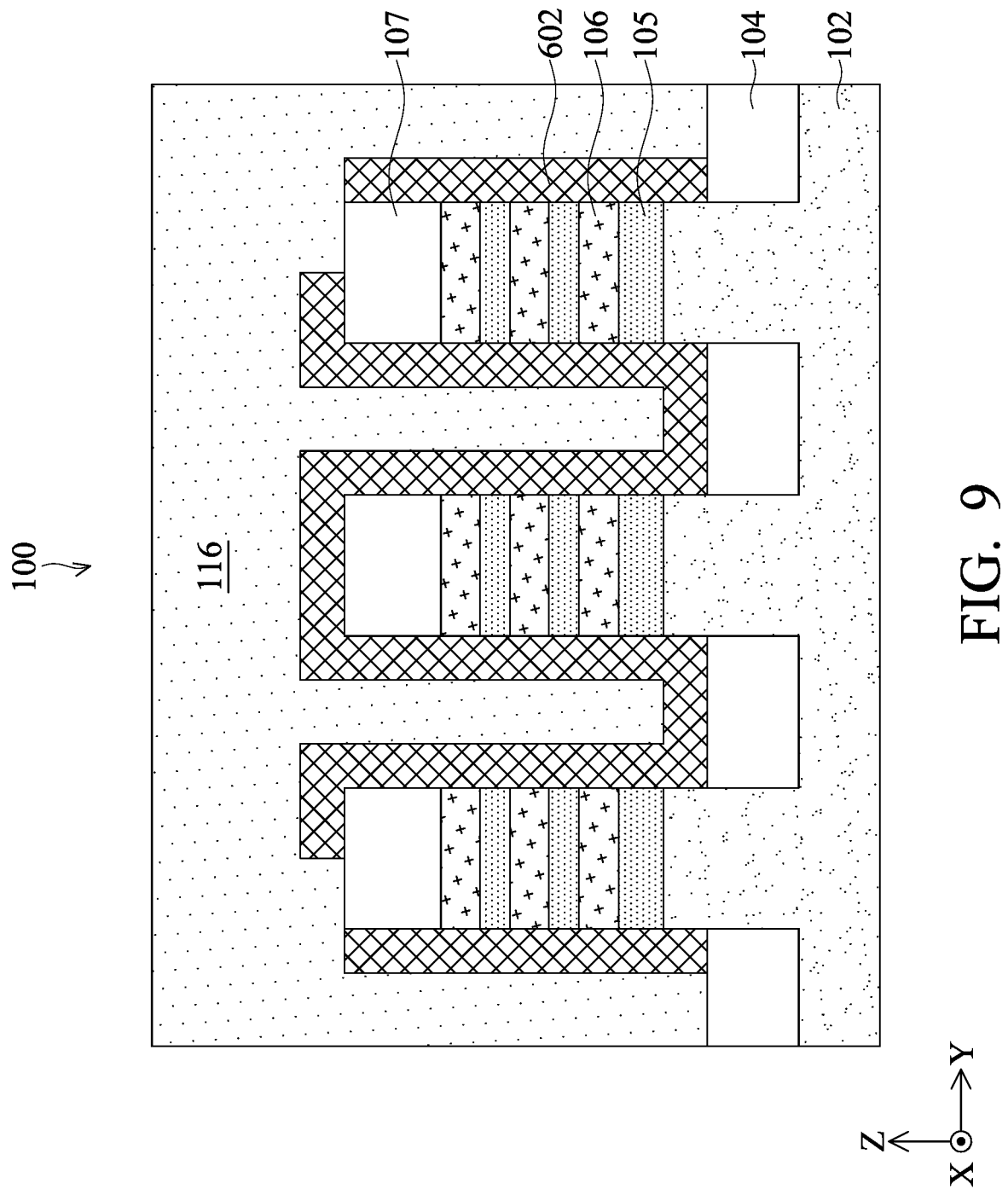

Referring to FIG. 9, the photoresist layer 702 is removed. After removing the photoresist layer 702, a first isolation material 902 is formed over the workpiece 100. Specifically, the first isolation material 902 is formed to fill the trenches between the fins 109, formed to fill the end regions 706, and formed over the fins 109, the cladding layer 602, and the isolation structure 104. In some embodiments, a composition of the first isolation material 902 may be similar to a composition of the isolation structure 104. In some embodiments, the first isolation material 902 includes a low-k dielectric material such as a dielectric material including Si, O, N, and C (for example, silicon oxide ($SiO_2$), silicon nitride, silicon oxynitride, silicon oxy carbide, silicon oxy carbon nitride). In some embodiments, the first isolation material 902 includes tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), other low-k dielectric materials, or combinations thereof. In these embodiments, the first isolation material 902 may be deposited using CVD, SACVD, FCVD, ALD, PVD, spin-on coating, and/or other suitable process.

Figure 10:
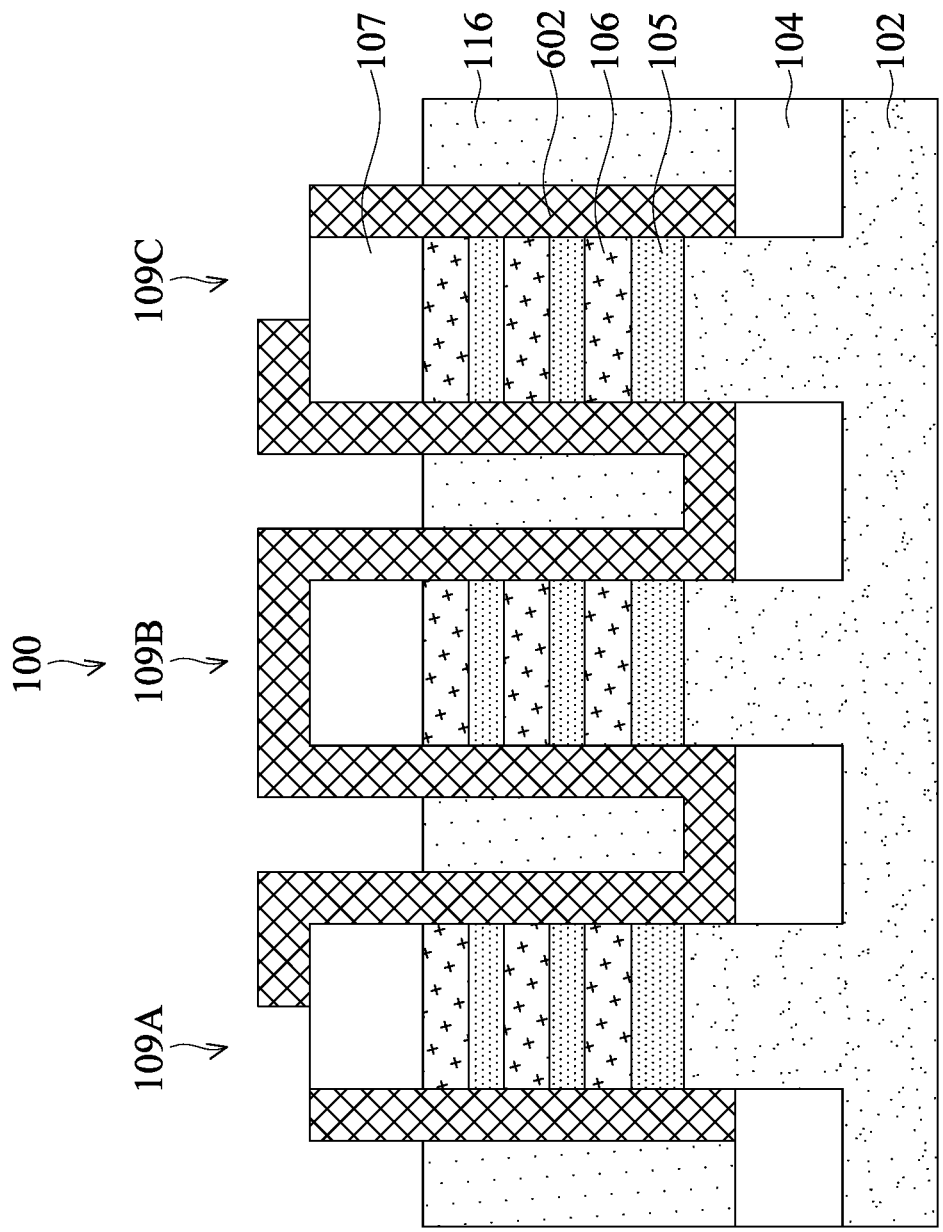

Referring to FIG. 10, the first isolation material 902 is planarized (e.g., by a chemical-mechanical planarization (CMP) process) and recessed (e.g., by an etching process, a wet etching process, and/or a combination thereof). The first isolation material 902 is recessed to have top surfaces below the top surfaces of the hard mask layer 107. In some other embodiments, the top surfaces of the first isolation material 902 and the topmost surfaces of the semiconductor layers 106 are substantially coplanar. The first isolation material 902 is between or around neighboring fins 109. Specifically, the stack portions of the fins 109 are surrounded by the first isolation material 902. In some aspects, the first isolation material 902 also extends in the X-direction and arranged with the fins 109 in the Y-direction.

Figure 11:
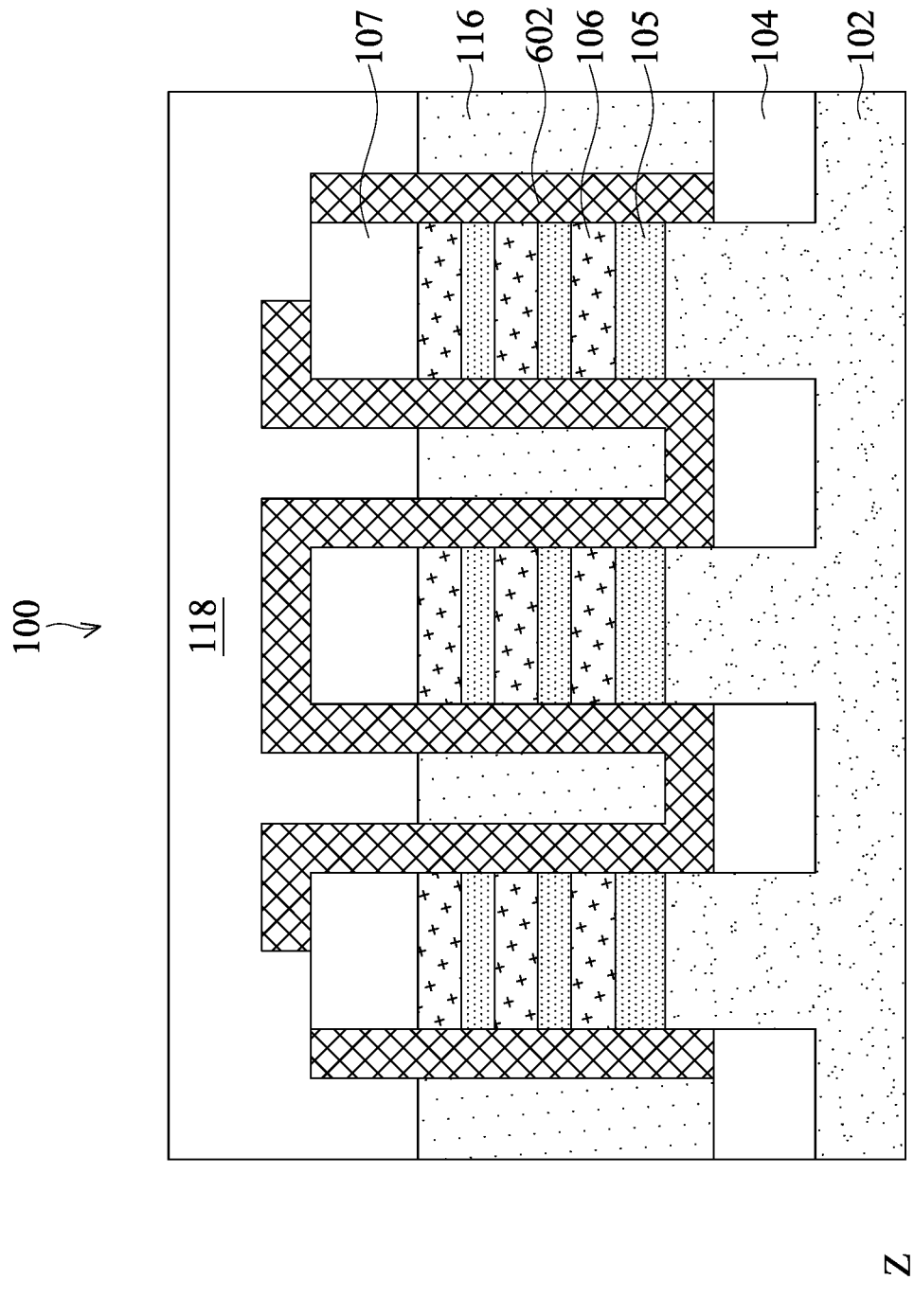

Referring to FIG. 11, a second isolation material 1102 is formed over the workpiece 100. Specifically, the second isolation material 1102 is formed between and over the hard mask layer 107 and the cladding layer 602, and over the first isolation material 902. The dielectric material may include high-K dielectrics, such as $HfO_2$, HfSiOx (such as $HfSiO_4$), HfSiON, HfLaO, HfTaO, HfTiO, HfZrO, $HfAlO_x$, $ZrO_2$, $ZrSiO_2$, AlSiO, $Al_2O_3$, $TiO_2$, LaO, LaSiO, $Ta_2O_3$, $Ta_2O_5$, $Y_2O_3$, $SrTiO_3$, BaZrO, $BaTiO_3$ (BTO), (Ba,Sr) $TiO_3$ (BST), $Si_3N_4$, hafnium dioxide-alumina ($HfO_2$—$Al_2O_3$) alloy, other suitable high-k dielectric material, or combinations thereof. In some embodiments, the dielectric material may be deposited using ALD, CVD, PVD, oxidation-based deposition process, other suitable process, or combinations thereof.

Figure 12:
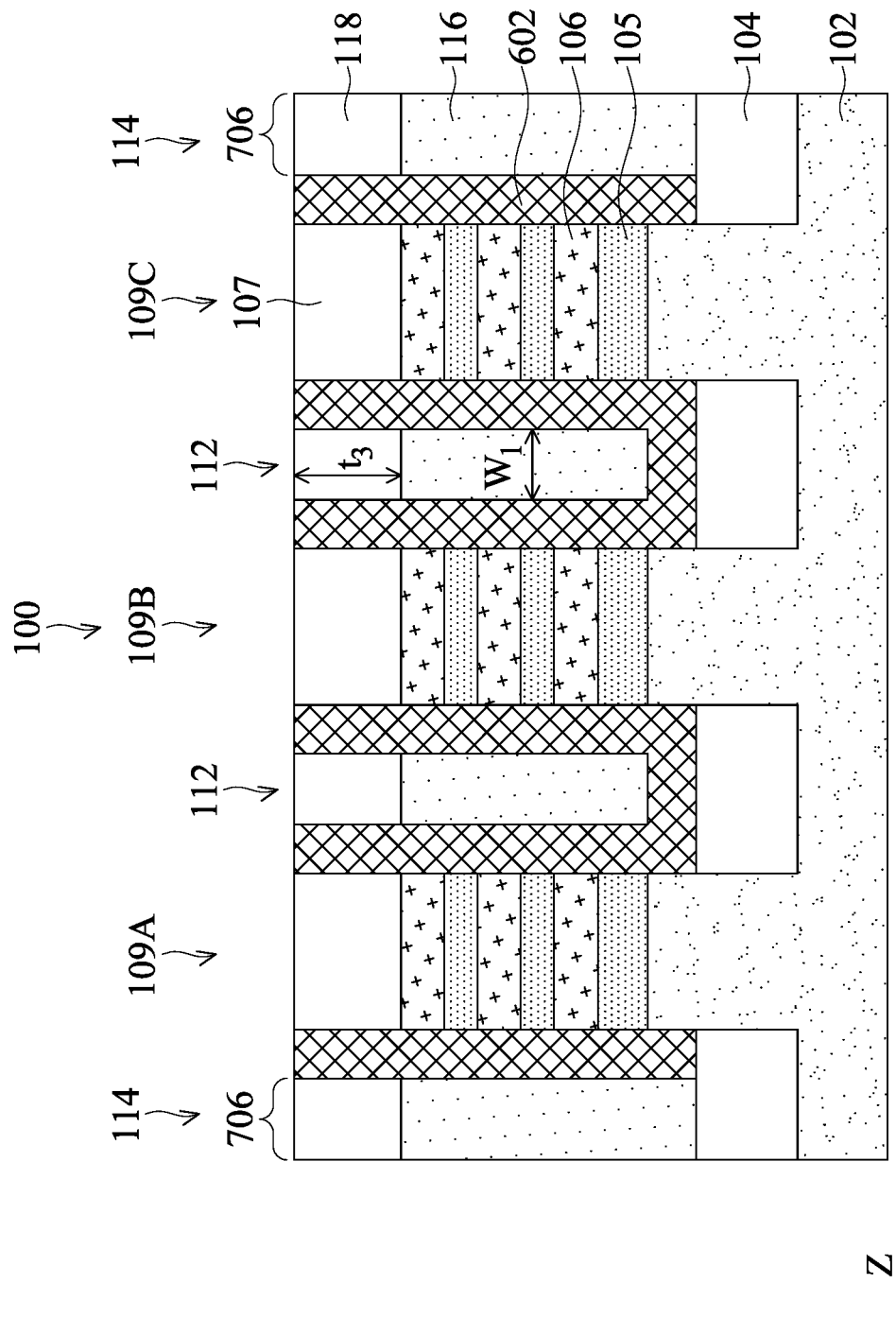

Referring to FIG. 12, a CMP process is performed to remove excess second isolation material 1102 over the hard mask layer 110. The top surfaces of the hard mask layer 107 and top surfaces of the cladding layer 602 are exposed after the CMP process. Further, in some embodiments, the top surfaces of the hard mask layer 110, the cladding layer 402, and the second isolation material 1102 are substantially coplanar after the CMP process. Similarly, in some aspects, the second isolation material 1102 extends in the X-direction and arranged with the fins 112 in the Y-direction.

As shown in FIG. 12, After the CMP process, portions of the first isolation material 902 and the second isolation material 1102 between the fins 109 form the isolation features 112 discussed above, and portions of the first isolation material 902 and the second isolation material 1102 in the end regions 706 form the isolation features 114 discussed above. The isolation features 112 and 114 are over the isolation structure 104. The isolation features 112 each contact two sidewalls of the cladding layer 602. The isolation features 114 in the end regions 706 contact the top surfaces of the isolation structure 104. The isolation features 114 are in the end regions 706 as boundaries to separate the as the resultant structure from other devices (not shown), as discussed above. In some embodiments, bottom surfaces of the isolation features 112 and 114 are lower than the bottommost semiconductor layers 106 (or bottommost surfaces of the semiconductor layers 106). The isolation features 112 and 114 have a width $w_1$ in a range from about 15 nm to about 25 nm. In some embodiments, the second isolation material 1102 of the isolation features 112 and 114 after the CMP process have a thickness $t_3$ in a range from about 20 nm to about 30 nm.

Figure 13:
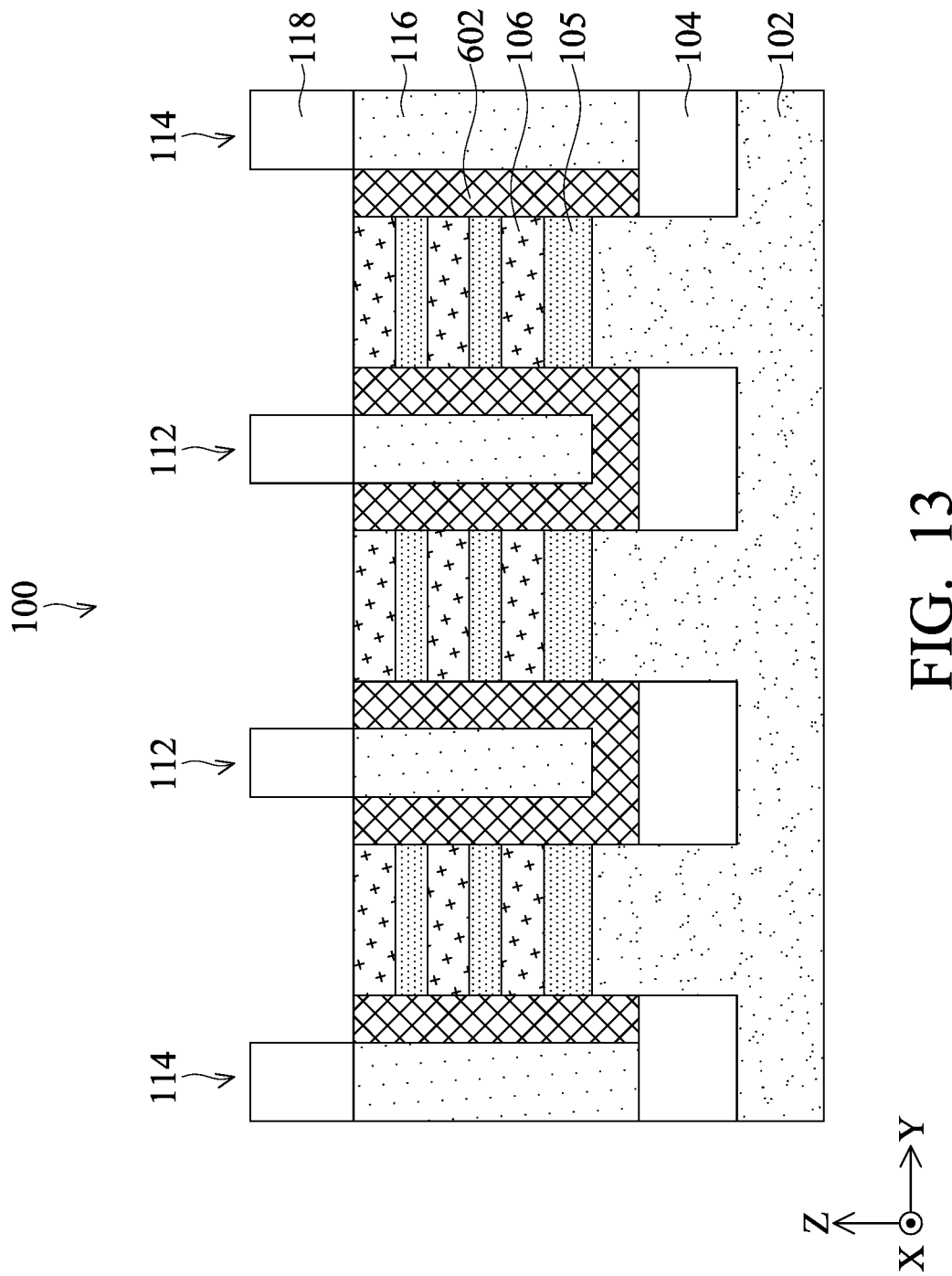

Referring to FIG. 13, after the CMP process, the workpiece 100 is anisotropically etched to selectively remove a portion of the cladding layer 402 and the hard mask layer 110 to expose the topmost semiconductor layer 106 (or the topmost surface of the semiconductor layers 106), without substantially damaging the second isolation material 1102 of the isolation features 112 and 114. The anisotropic etch process may include be a single stage etch process or a multi-stage etch process. In some implementations, the anisotropic etch process may include hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 14A:
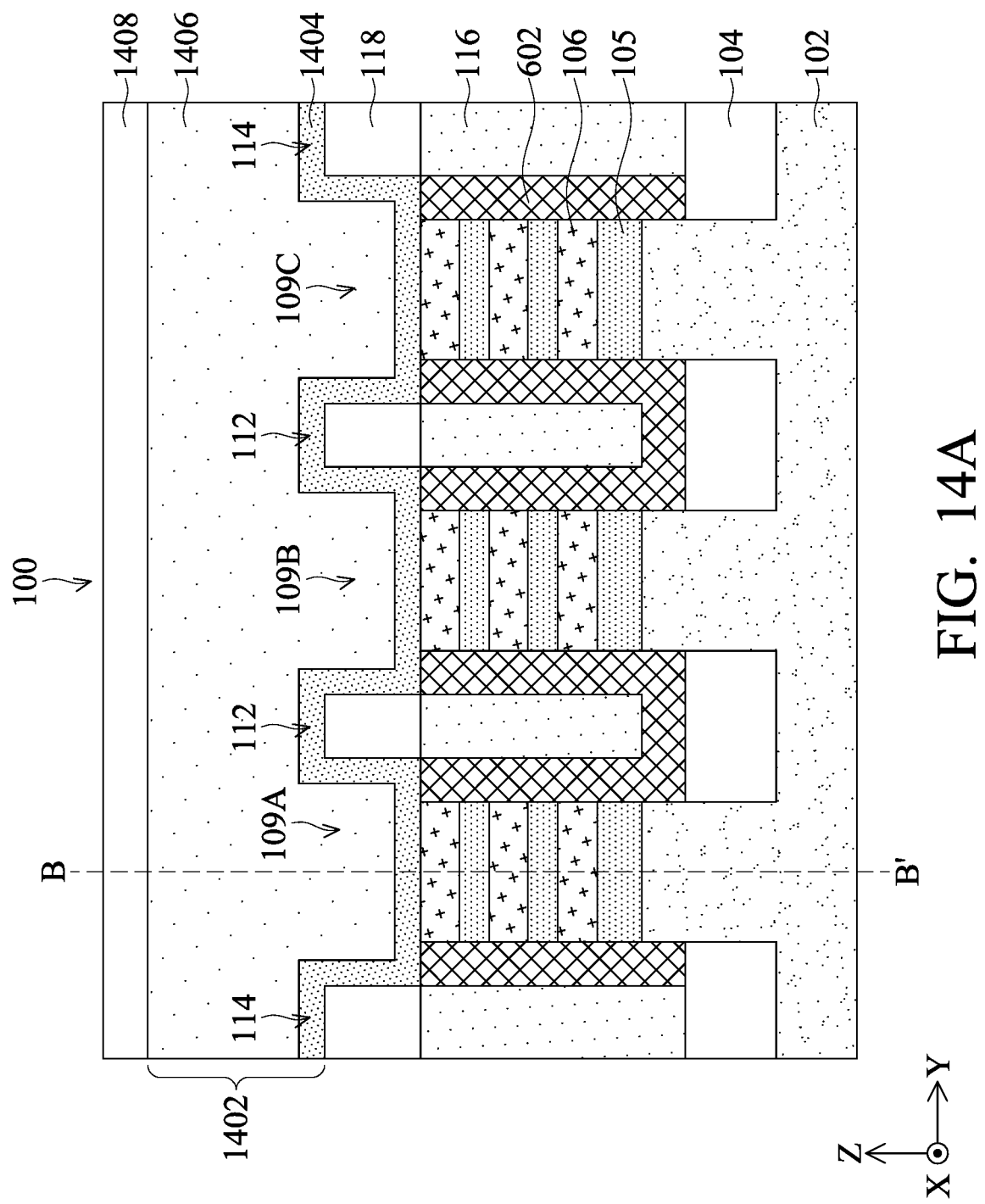

Referring to FIG. 14A, a dummy gate structure 1402 may be formed over the fins 109, the isolation features 112 and 114, and the cladding layer 602. In some embodiments, to form the dummy gate structure 1402, a dummy interfacial material of a dummy interfacial layer 1404 is first formed over the fins 109, the isolation features 112 and 114, and the cladding layer 602. In some embodiments, the dummy interfacial layer 1404 may include, for example, a dielectric material such as a nitride (e.g., silicon nitride, silicon oxynitride), a carbide (e.g., silicon carbide), an oxide (e.g., silicon oxide), or some other suitable material. Then, in some embodiments, a dummy gate material of a dummy gate electrode 1406 is formed over the dummy interfacial material. The dummy gate material may include a conductive material selected from a group comprising of polysilicon, W, Al, Cu, AlCu, Ti, TiAlN, TaC, TaCN, TaSiN, Mn, Zr, TiN, Ta, TaN, Co, Ni, and/or combinations thereof. The dummy gate material and/or the dummy interfacial material may be formed by way of a thermal oxidation process and/or a deposition process (e.g., PVD, CVD, PECVD, and ALD). In some embodiments, a mask structure 1408 is formed over the dummy gate material. In some embodiments, the mask structure 1408 may be formed using photolithography and removal (e.g., etching) processes. In some embodiments, the mask structure 1408 may include photoresist materials or hard mask materials. After the formation of the mask structure 1408, a removal process (e.g., etching) may be performed to remove portions of the dummy gate material and the dummy interfacial material that do not directly underlie the mask structure 1408 (not shown), thereby forming the dummy gate structure 1402 with the dummy gate electrode 1406 and the dummy interfacial layer 1404. The dummy gate structures 1402 may undergo a gate replacement process through subsequent processing to form metal gates, such as a high-k metal gate, as discussed in greater detail below.

Figure 14B:
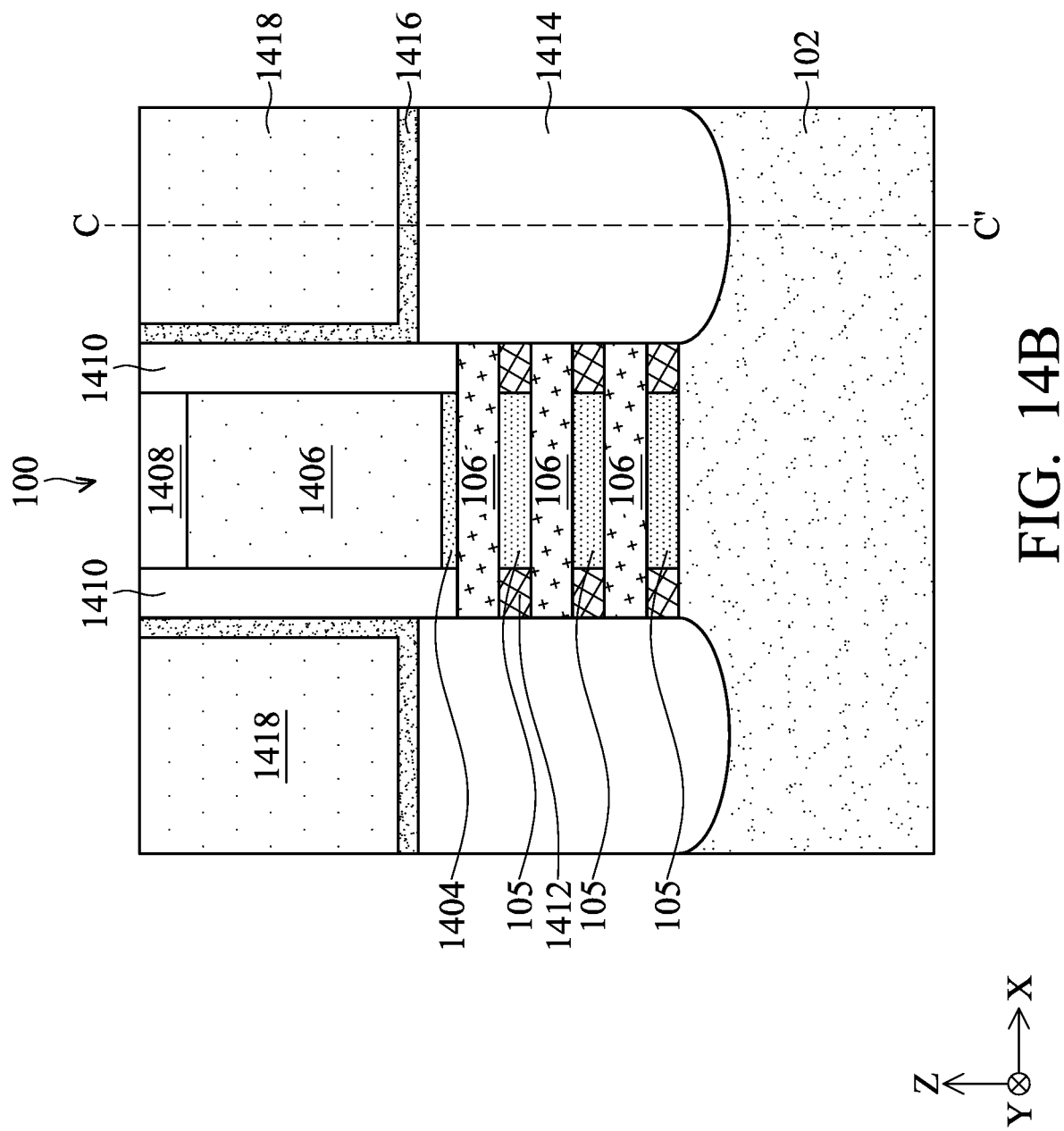
FIG. 14B is cross sectional view of an embodiment of a workpiece of the present disclosure along line B-B' of FIG. 14A, in accordance with some embodiments.
Figure 14C:
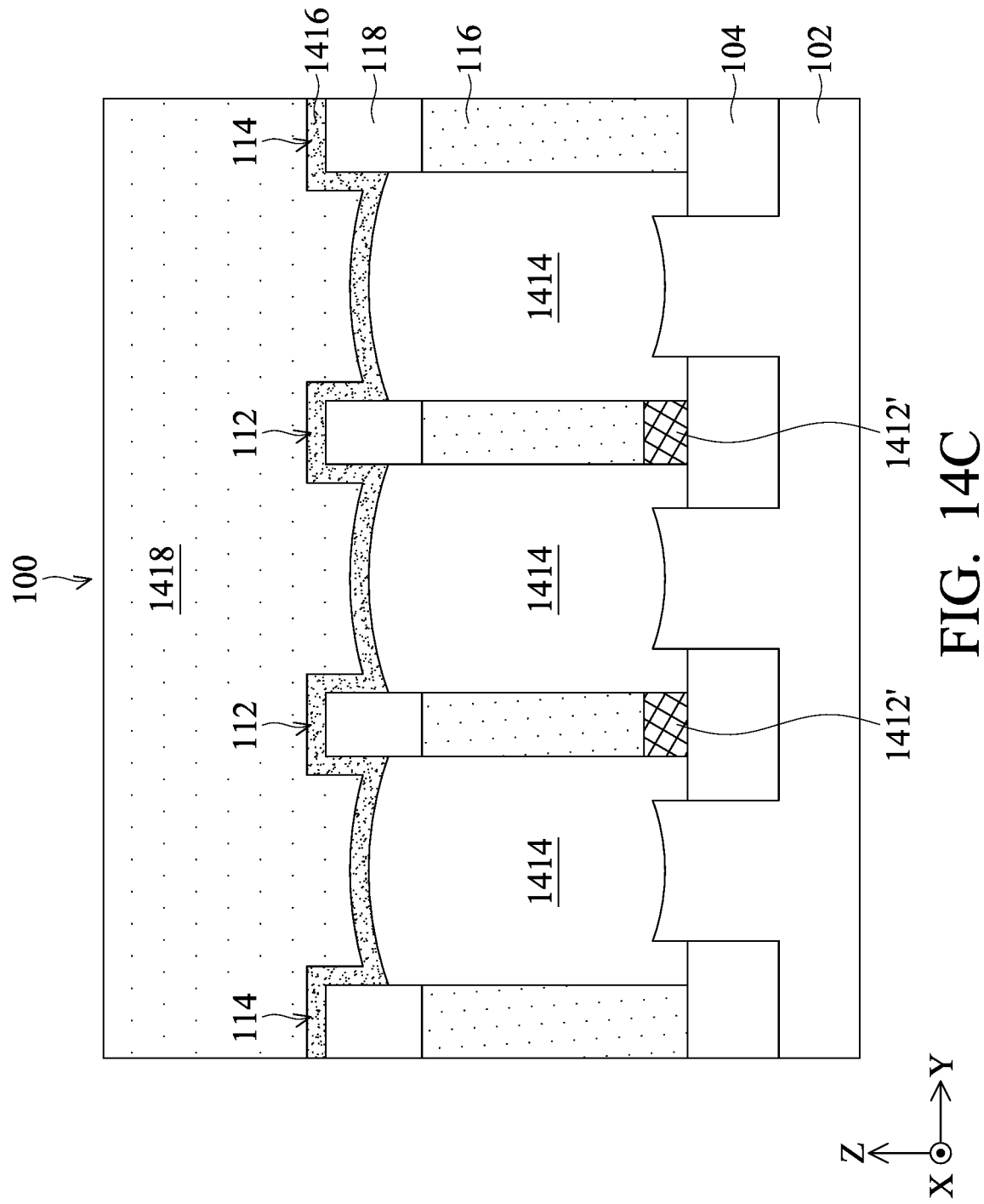
FIG. 14C is cross sectional view of an embodiment of a workpiece of the present disclosure along line C-C' of FIG. 14B, in accordance with some embodiments.

After forming dummy gate structure 1402, subsequent processes are performed to form various features, such as gate spacers, inner spacers, source/drain features, a contact etch stop layer (CESL), and an interlayer dielectric (ILD) layer. FIGS. 14B and 14C are cross sectional views of the workpiece 100 after forming dummy gate structure 1402 followed by the subsequent processes, in which FIG. 14B is the cross sectional view along line B-B' of FIG. 14A, and FIG. 14C is the cross sectional view along line C-C' of FIG. 14B.

As shown in FIG. 14B, gate spacers 1410 are formed on sidewalls of the dummy interfacial layer 1404, the dummy gate electrode 1406, and the mask structure 1408, and over the topmost semiconductor layer 106 (or the topmost surface of the semiconductor layers 106). The gate spacers 1410 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. The gate spacers 1410 may include a single layer or a multi-layer structure. In some embodiments, the gate spacers 1410 may be formed by depositing a spacer layer (containing the dielectric material) over the fins 109, the isolation features 112 and 114, and the dummy gate structure 1402, followed by an anisotropic etching process to remove top portions of the spacer layer from the top surfaces of the isolation features 112 and 114, the fins 109, and the dummy gate structure 1402. After the etching process, portions of the spacer layer on sidewall surfaces of the dummy gate structure substantially remain and become the gate spacers 1410. In some embodiments, the anisotropic etching process is a dry (e.g., plasma) etching process. Additionally or alternatively, the formation of the gate spacers 1410 may also involve chemical oxidation, thermal oxidation, ALD, CVD, and/or other suitable methods. The gate spacers 1410 may also be interchangeably referred to as the top spacers.

Still referring to FIGS. 14B and 14C, inner spacers 1412 are formed between the semiconductor layers 106. In some embodiments, sidewalls of the inner spacers 1802 are aligned to sidewalls of the gate spacers 1402 and the semiconductor layers 106, as shown in FIG. 14B. In order to form the inner spacers 1802, portions of the fins 109 and the cladding layer 602 uncovered by the dummy gate structure 1402 and the gate spacers 1410 are recessed to form source/drain trenches (not shown) in the fins 109 to expose sidewalls of the semiconductor layers 105. Side portions of the semiconductor layers 105 under the gate spacers 1410 are then removed via a selective etching process to form gaps (not shown). Specifically, the selective etching process is performed that selectively etches the side portions of the semiconductor layers 105 and the cladding layer 602 below the gate spacers 1410, with minimal (or no) etching of semiconductor layers 106, so that the gaps are formed between the semiconductor layers 106 as well as between the semiconductor layers 106 and the semiconductor substrate 102, below the gate spacers 1410. The selective etching process is a dry etching process, a wet etching process, other suitable etching process, or combinations thereof. Further, the cladding layer under the isolation features 112 and uncovered by the dummy gate structure 1402 is also removed during the selective etching process.

After the selective etching process, a deposition process forms a spacer layer into the source/drain trenches and the gaps, such as CVD, PVD, ALD, HDPCVD, MOCVD, RPCVD, PECVD, LPCVD, ALCVD, APCVD, other suitable methods, or combinations thereof. The deposition process is configured to ensure that the spacer layer fills the gaps between the semiconductor layers 106 as well as between the semiconductor layer 106 and the semiconductor substrate 102 under the gate spacers 1410. Further, gaps under the isolation features 112 and uncovered by the dummy gate structure 1402 are also filled with the spacer layer.

An etching process is then performed that selectively etches the spacer layer to form inner spacers 1412 (as shown in FIG. 14B) and spacer structures 1412' (as shown in FIG. 14C) with minimal (to no) etching of the semiconductor layer 106, the semiconductor substrate 102, the dummy gate structure 1402, and the gate spacers 1410. The spacer layer (and thus inner spacers 1412 and spacer structures 1412') includes a material that is different than a material of the semiconductor layers 106 and a material of the gate spacers 1410 to achieve desired etching selectivity during the etching process. In some embodiments, the inner spacers 1412 and spacer structures 1412' include a dielectric material that includes silicon, oxygen, carbon, nitrogen, other suitable material, or combinations thereof (for example, silicon oxide ($SiO_2$), silicon oxynitride (SiON), silicon oxycarbide (SiOC), silicon oxycarbon nitride (SiOCN)). In some embodiments, the inner spacer layer includes a low-k dielectric material, such as those described herein.

Still referring to FIGS. 14B and 14C, source/drain features 1414 are formed in the source/drain trenches. The source/drain features 1414 contact the sidewalls of the gate spacers 1410, the semiconductor layers 106, and the inner spacers 1412, as shown in FIG. 14B. In some embodiments, the source/drain features 1414 contact sidewalls of the isolation features 112, the spacer structures 1412', and the isolation features 114, as shown in FIG. 14C. It should be noted that the spacer structures 1412' separates the source/drain features 1414 from each other to avoid the source/drain features 1414 connected together. In some embodiments, the source/drain features 1414 may have top surfaces that extend higher than the top surface of the topmost semiconductor layer 106 (e.g., in the Z-direction). In some embodiments, the source/drain features 1414 may have the top surfaces higher than the top surfaces of the first isolation material 902 of the isolation features 112 and 114, as shown in FIG. 14C. In other embodiments, portions of the source/drain features 1414 contact the top surface of the isolation structure 104. The semiconductor layers 106 that extend from one source/drain feature 1414 to the other source/drain feature 1414 may form channels of the GAA device, so that the semiconductor layers 106 may also be referred to as channel layers.

One or more epitaxy processes may be employed to grow the source/drain features 1414. Epitaxy processes can implement CVD deposition techniques (for example, vapor-phase epitaxy (VPE), UHVCVD, LPCVD, and/or PECVD), molecular beam epitaxy, other suitable SEG processes, or combinations thereof. The source/drain features 1414 may include any suitable semiconductor materials. For example, the source/drain features 1414 in an n-type GAA device may include silicon (Si), silicon carbide (SiC), silicon phosphide (SiP), silicon arsenide (SiAs), silicon phosphoric carbide (SiPC), or combinations thereof; while the source/drain features 1414 in a p-type GAA device may include silicon (Si), silicon germanium (SiGe), germanium (Ge), silicon germanium carbide (SiGeC), or combinations thereof. The source/drain features 1414 may be doped in-situ or ex-situ. For example, the epitaxially grown Si source/drain features may be doped with carbon to form silicon:carbon (Si:C) source/drain features, phosphorous to form silicon:phosphor (Si:P) source/drain features, or both carbon and phosphorous to form silicon carbon phosphor (SiCP) source/drain features; and the epitaxially grown SiGe source/drain features may be doped with boron. One or more annealing processes may be performed to activate the dopants in the source/drain features 1414. The annealing processes may include rapid thermal annealing (RTA) and/or laser annealing processes.

Still referring to FIGS. 14B and 14C, a contact etch stop layer (CESL) 1416 over the source/drain features 1414 and an interlayer dielectric (ILD) layer 1418 over the CESL 1416 are formed. Specifically, the CESL 1416 is conformally formed on the sidewalls of the gate spacers 1410, over the top surfaces of the source/drain features 1414, on the sidewalls and top surfaces of the second isolation material 1102 of the isolation features 112 and 114, as shown in FIGS. 14B and 14C. The ILD layer 1418 is formed over and between the CESL 1416. The CESL 1416 includes a material that is different than ILD layer 1418. The CESL 1416 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 1418 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 1418 may be formed by PECVD (plasma enhanced CVD), FCVD (flowable CVD), or other suitable methods. Subsequent to the deposition of the CESL 1416 and the ILD layer 1418, a CMP process and/or other planarization process is performed on the CESL 1416 and the ILD layer 1418 until the top surface of the mask structure 1408 is exposed.

Figure 15:
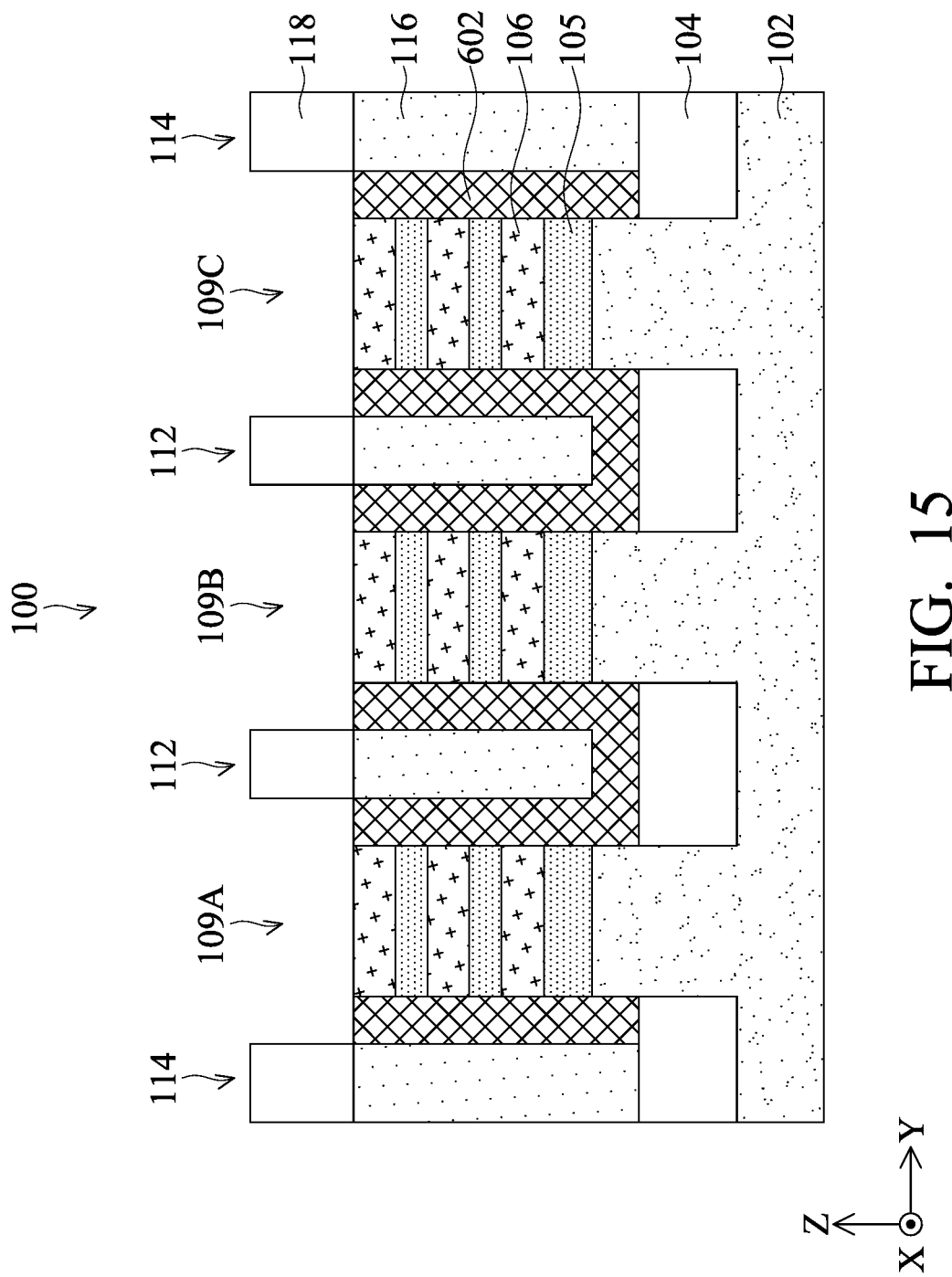

Referring to FIG. 15, the dummy gate structure 1402 and the mask structure 1408 are selectively removed through any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate structures 1402 and the mask structure 1408. Then, the dummy gate structures 1408 and the mask structure 1408 are selectively etched through the masking element. The gate spacers 1410 (not shown in FIG.

15) may be used as the masking element or a part thereof. Etch selectivity may be achieved by selecting the appropriate etching chemicals, and the dummy gate structures 1402 may be removed without substantially affecting the CESL 1416 and the ILD layer 1418 shown in FIGS. 14B and 14C. After removing, expose the top surfaces of the topmost semiconductor layers 106 and the cladding layer 602 are exposed, as shown in FIG. 15.

Figure 16:
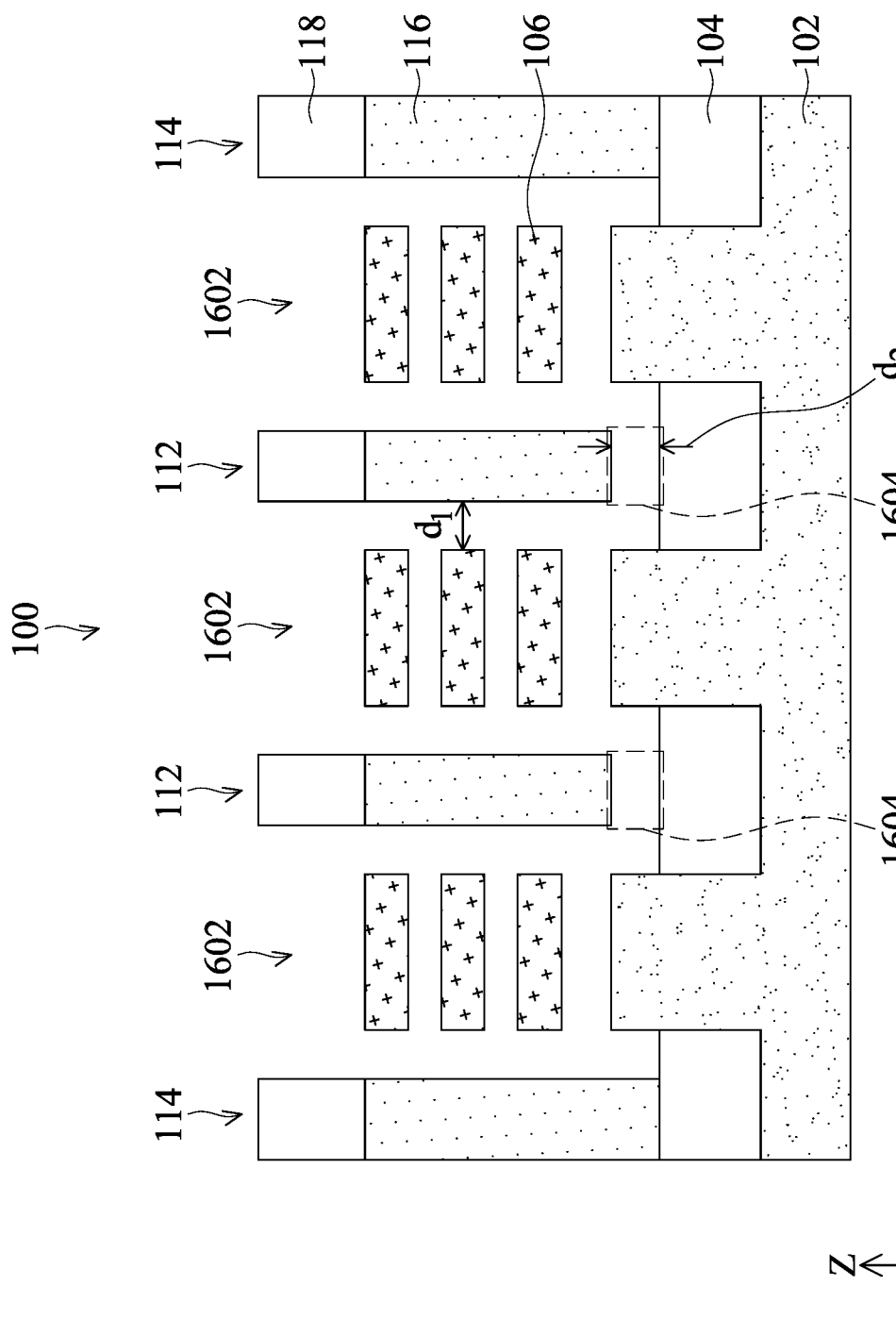

Referring to FIG. 16, the semiconductor layers 105 of the fins 109 and the cladding layer 602 are selectively removed after removing the dummy gate structure 1402 and the mask structure 1408 to form gate trenches 1602 and bottom gaps 1604 under the isolation features 112, using a wet or dry etching process for example, so that the semiconductor layers 106 and are exposed to form nanostructures. Such a process may also be referred to as a wire release process, a nanowire release process, a nanosheet release process, a nanowire formation process, a nanosheet formation process, or a wire formation process. In some embodiments, the removal of the semiconductor layers 105 and the cladding layer 402 causes the exposed semiconductor layers 106 to be spaced apart from each other in the vertical direction (e.g., in the Z-direction). It should be noted that the sidewalls of the semiconductor layers 106 is separated from the sidewalls of the isolation features 112 and 114 by a distance $d_1$ in a range from about 8 nm to about 15 nm due to the thickness $t_1$ of the sidewalls of the cladding layer 602 discussed above. In some embodiments, the bottom surfaces of the isolation features 112 is separated from the top surfaces of the isolation structure 104 by a distance $d_2$ in a range from about 10 nm to about 20 nm due to the thickness $t_2$ of the cladding layer 602 discussed above. In some embodiments, the exposed semiconductor layers 106 may be removed in subsequent processes for forming a structure similar to the GAA transistor A' of the semiconductor device 100B discussed above.

Figure 17:
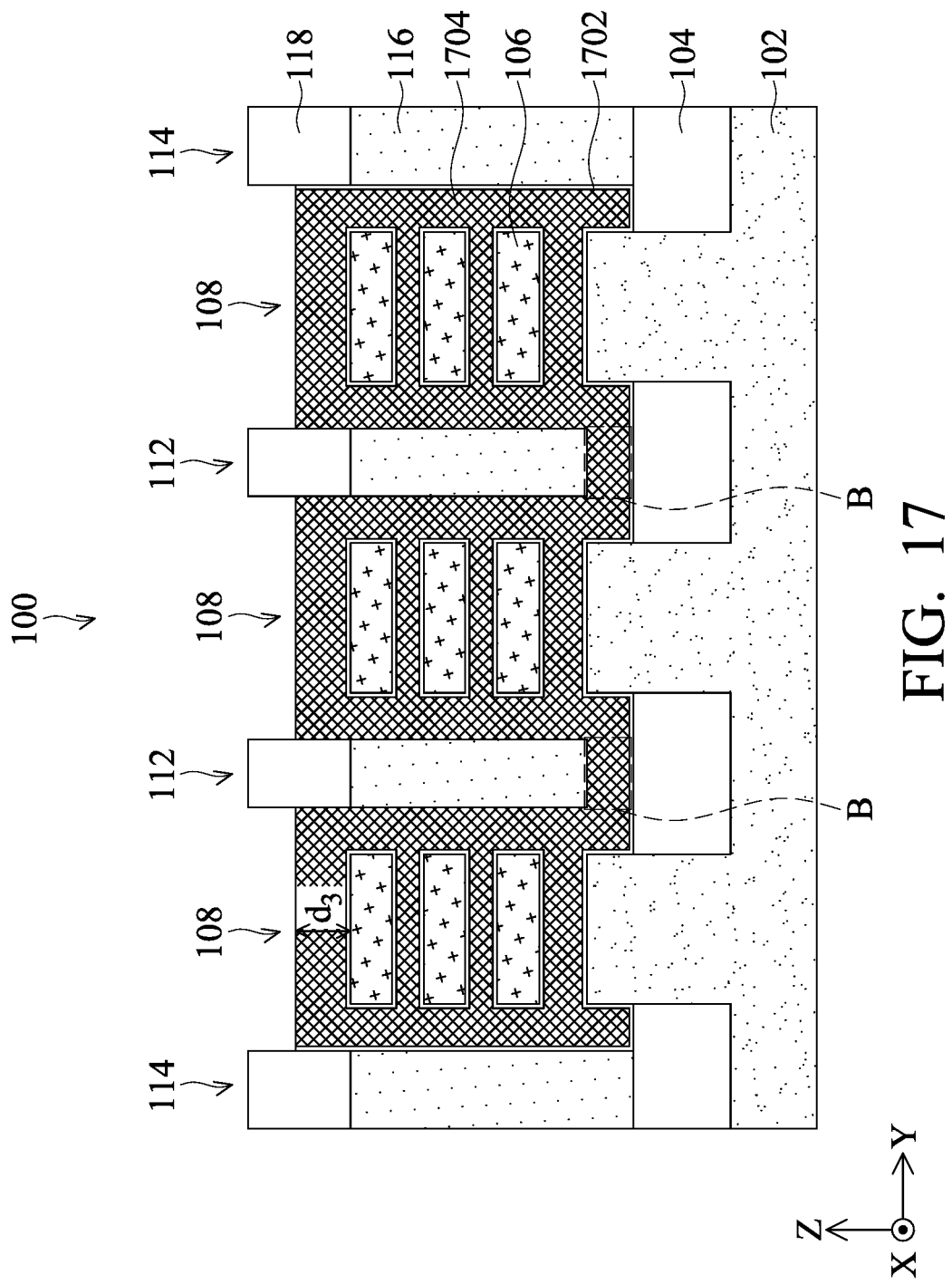

Referring to FIG. 17, a gate dielectric layer 1702 and a gate electrode 1702 over the gate dielectric layer 2304 are formed to fill the gate trenches 1602 and the bottom gaps 1604 to construct the gate structures 108 and the connection structures B. In some embodiments, the gate dielectric layer 1702 is formed to wrap around the semiconductor layers 106. Additionally, the gate dielectric layer 1702 also formed over the top surface of the isolation structure 104, on the top surfaces and sidewalls of the semiconductor substrate 102 (the base portion of the fins 109), and on the sidewalls of the isolation features 114, as shown in FIG. 17. The gate dielectric layer 1702 may include a dielectric material having a dielectric constant greater than a dielectric constant of $SiO_2$, which is approximately 3.9. For example, the gate dielectric layer 1702 may include hafnium oxide ($HfO_2$), which has a dielectric constant in a range from about 18 to about 40. Alternatively, the gate dielectric layer 1702 may include other high-K dielectrics, such as $TiO_2$, $HfZrO$, $Ta_2O_3$, $HfSiO_4$, $ZrO_2$, $ZrSiO_2$, $LaO$, $AlO$, $ZrO$, $TiO$, $Ta_2O_5$, $Y_2O_3$, $SrTiO_3$ (STO), $BaTiO_3$ (BTO), $BaZrO$, $HfLaO$, $HfSiO$, $LaSiO$, $AlSiO$, $HfTaO$, $HfTiO$, (Ba, Sr) $TiO_3$ (BST), $Al_2O_3$, $Si_3N_4$, oxynitrides (SiON), combinations thereof, or other suitable material.

In some embodiments, an interfacial layer are formed to wrap around the exposed semiconductor layers 106 before the formation of the gate dielectric layer 1702, so that the gate dielectric layer 1702 is separated from semiconductor layers 106 by the interfacial layer. In some embodiments, the interfacial layer may include a dielectric material such as silicon oxide ($SiO_2$), $HfSiO$, or silicon oxynitride (SiON). The interfacial layer may be formed by chemical oxidation, thermal oxidation, ALD, CVD, and/or other suitable method.

Still referring to FIG. 17, the gate electrode 1704 is formed to fill the remaining spaces of the gate trenches 1602, the bottom gaps 1604, and over the gate dielectric layer 1702 in such a way that the gate electrode 1704 wraps around the semiconductor layers 106, the gate dielectric layer 1702, and the interfacial layers (if present). In some embodiments, in order to goodly fill the gate trenches 1602 and the bottom gaps 1604, the gate dielectric layer 1702 and the gate electrode 1704 are formed by ALD processes. The gate electrode layer 1704 and the gate dielectric layer 1702 may be collectively constructed and/or called as the gate structures 108 wrapping around the semiconductor layers 106. In some embodiments, the gate electrode layer 1704 and the gate dielectric layer 1702 under (or covered) by the isolation features 112 may be may be collectively constructed and/or called as the connection structures B. As discussed above, the connection structures B and the gate structures 108 are formed in the same fabrication process, and there are no real interfaces between the connection structures B and the gate structures 108. The gate electrode 1704 may include a single layer or alternatively a multi-layer structure. In some embodiments, the gate electrode 1704 may include a capping layer, a barrier layer, an n-type work function metal layer, a p-type work function metal layer, and a fill material (not shown).

The capping layer may be formed adjacent to the gate dielectric layer 1702 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The n-type work function metal layer may be formed adjacent to the barrier layer. In an embodiment the n-type work function metal layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. However, any suitable materials may be utilized to form the n-type work function metal layer.

The p-type work function metal layer may be formed adjacent to the n-type work function metal layer. In an embodiment, the p-type work function metal layer may be formed from a metallic material such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like.

Still referring to FIG. 17, after forming the gate dielectric layer 1702 and the gate electrode layer 1704, the gate dielectric layer 1702 and the gate electrode layer 1704 are recessed so that its top surface is below the top surfaces of the isolation features 112 and 114 (or the top surfaces of the second isolation material 1102), but above the top surfaces of the first isolation material 902 of the isolation features 112 and 114. In other words, the top surfaces of the second isolation material 1102 of the isolation features 112 and 114 are higher than the top surfaces of the gate dielectric layer 1702 and the gate electrode layer 1704. The recessing of the gate electrode layer 1704 may implement a wet etching or a dry etching process that selectively etches the gate electrode layer 1704. In some embodiments, the etching process also etches the gate dielectric layer 1702, so that the gate dielectric layer 1702 over the top surfaces and top sidewalls of the isolation features 114 are removed. In some embodiments, a distance $d_3$ between the top surfaces of the gate structures 108 (or the gate electrode layer 1704) and the topmost surfaces of the semiconductor layers 106 (or the top surfaces of the topmost semiconductor layers 106) is in a range from about 10 nm to 20 nm. After the recessing of etching process, the gate structures 108 and the connection structures B connecting the gate structures 108 in the workpiece 100 are formed, as the gate structures 108 and the connection structures B of the semiconductor device 100A, 100B, 200A to 200C discussed above. In some embodiments, a thickness of the connection structures B is in a range from about 10 nm to about 20 nm due to the thickness $t_2$ of the cladding layer 602 discussed above. In some embodiments, a top surface of the connection structures B is higher than the top surface of the semiconductor substrate 102. In other embodiments, the top surface of the connection structures B and the top surface of the semiconductor substrate 102 are coplanar. As shown in FIG. 17, the isolation features 112 are separated from the isolation structure 104 by the connection structures B.

Figure 18:
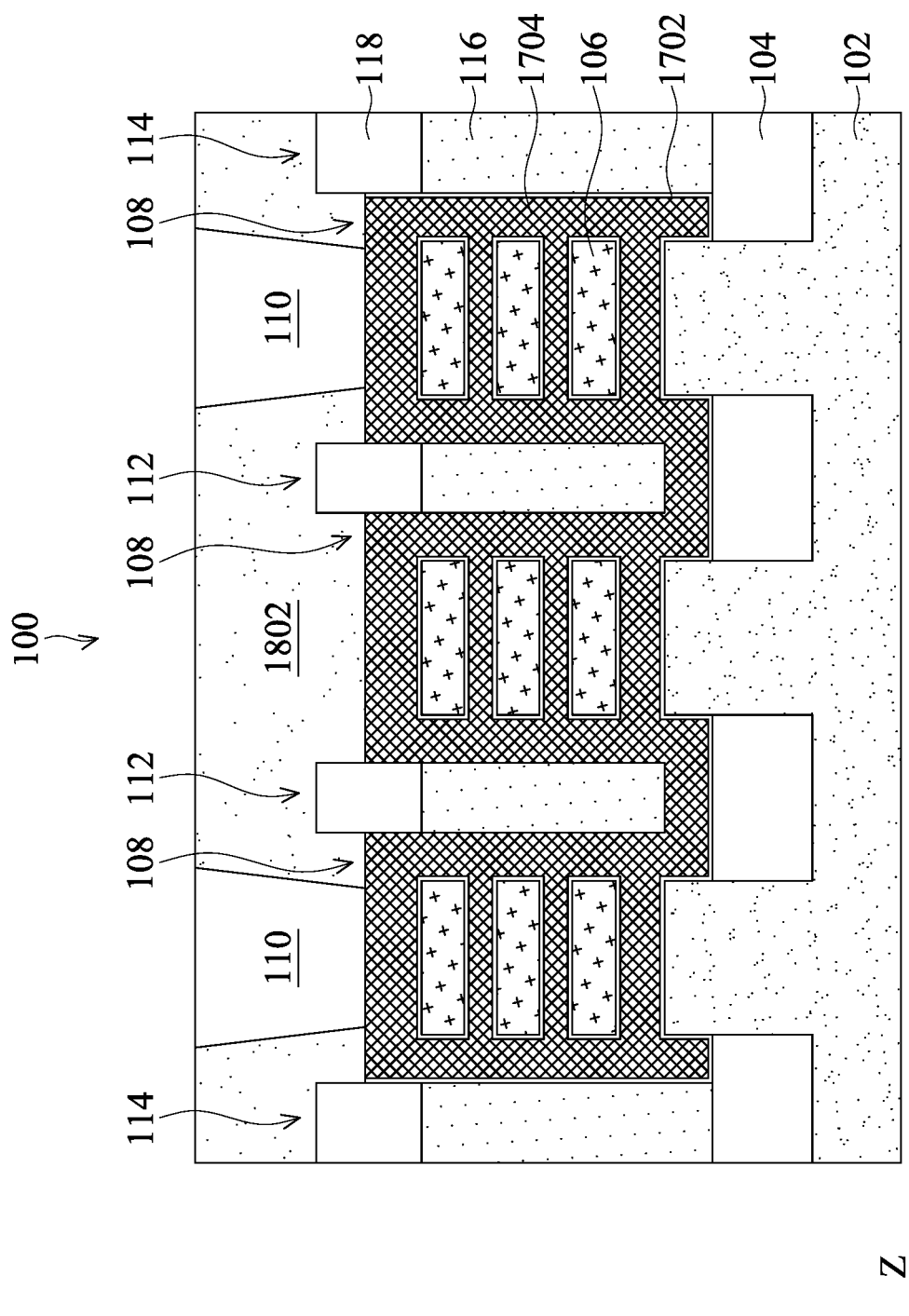

Referring to FIG. 18, a dielectric layer 1802 is formed over the workpiece 100. The dielectric layer 1802 may be formed by any suitable processes, such as CVD, PECVD, flowable CVD (FCVD), or combinations thereof. The dielectric layer 1802 covers the top surfaces of the isolation features 112 and 114 as well as the top surfaces of the gate structure 108. The dielectric layer 1802 may include a dielectric material, such as $SiO_2$, SiOC, SiON, SiOCN, nitride-based dielectric, metal oxide dielectric, $HfO_2$, $Ta_2O_5$, $TiO_2$, $ZrO_2$, $Al_2O_3$, $Y_2O_3$, or combinations thereof.

Still referring to FIG. 18, two gate contacts 110 are formed in the dielectric layer 1802 and over the gate structure 108. Each of the gate contacts 110 also connects to the gate structures 108 between the isolation features 112 and 114. More specifically, one gate contact 110 connect to the left gate structures 108 and the other gate contact 110 connect to the right gate structures 108. Accordingly, the resultant structure of the workpiece 100 is formed as similar to the above semiconductor device 200A. The gate contacts 110 may each include a conductive material such as Al, Cu, W, Co, Ti, Ta, Ru, TiN, TiAl, TiAlN, TaN, TaC, NiSi, CoSi, combinations of these, or the like, although any suitable material may be deposited using a deposition process such as sputtering, CVD, electroplating, electroless plating, or the like.

The embodiments disclosed herein relate to semiconductor structures and their manufacturing methods, and more particularly to semiconductor devices comprising gate-all-around (GAA) structures connected together by connection structures under the isolation features for measuring the resistance of the single GAA structure. Furthermore, the present embodiments provide one or more of the following advantages. The connection structures connect the gate structures to cause the measurement current to flow through the portions of the gate structure between the semiconductor layers in the GAA transistor during resistance measurement for extracting the precise gate resistance of the single GAA transistor.

Thus, one of the embodiments of the present disclosure described a semiconductor structure including a first transistor including a first gate structure, a second transistor including a second gate structure and arranged adjacent to the first transistor in a first direction, and a first isolation feature extending in a second direction perpendicular to the first direction. The first isolation feature is between the first gate structure and the second gate structure and in contact with the first gate structure and the second gate structure. The semiconductor structure further includes a first connection structure under the first isolation feature. The first connection structure electrically connects the first gate structure to the second gate structure.

In another of the embodiments, discussed is a semiconductor structure including a first transistor including first nanostructures over a semiconductor substrate and a first gate structure wrapping around the first nanostructures, a second transistor including a second gate structure, and a first isolation feature extending in a second direction perpendicular to the first direction. The second transistor is arranged adjacent to the first transistor in a first direction. The first isolation feature is adjacent to the first transistor. The semiconductor structure further includes a second isolation feature extending in the second direction and between the first gate structure and the second gate structure, and a first connection structure under the second isolation feature and connecting the first gate structure to the second gate structure.

In yet another of the embodiments, discussed is a method for manufacturing a semiconductor structure that includes forming fins over a semiconductor substrate. The fins each comprise first semiconductor layers and second semiconductor layers alternating stacked. The method further includes forming an isolation structure between the fins, forming a cladding layer on sidewalls of the fins and over the isolation structure, and forming isolation features between the fins and over the isolation structure. The isolation features each contact two sidewalls of the cladding layer. In some embodiments, the method further includes removing the second semiconductor layers and the cladding layer to form gate trenches and bottom gaps under the isolation features, and forming gate structures wrapping around the first semiconductor layers and connection structures filling the bottom gaps. The connection structures connect the gate structures to one another.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first transistor including a first gate structure;
a second transistor including a second gate structure and arranged adjacent to the first transistor in a first direction;
a first isolation feature extending in a second direction perpendicular to the first direction, wherein the first isolation feature is between the first gate structure and the second gate structure and in contact with the first gate structure and the second gate structure;
a first connection structure under the first isolation feature, wherein the first connection structure electrically connects the first gate structure to the second gate structure; and
an isolation structure under the first isolation feature, wherein a top surface of the isolation structure is partially overlapped by the first gate structure, the second gate structure, and the first connection structure, and the isolation structure interfaces the first connection structure.

2. The semiconductor device of claim 1, wherein a top surface of the first isolation feature is higher than top surfaces of the first gate structure and the second gate structure.

3. The semiconductor device of claim 1, further comprising:
first semiconductor layers stacked in a third direction and wrapped around by the first gate structure, wherein the third direction is perpendicular to the first direction and the second direction.

4. The semiconductor device of claim 3, wherein sidewalls of the first semiconductor layers are separated from a sidewall of the first isolation feature by about 8 nanometers to about 15 nanometers.

5. The semiconductor device of claim 1, further comprising:
a third transistor including a third gate structure and arranged adjacent to the second transistor in the first direction;
a second isolation feature extending in the second direction, wherein the second isolation feature is between the second gate structure and the third gate structure and is in contact with the second gate structure and the third gate structure; and
a second connection structure under the second isolation feature, wherein the second connection structure connects the second gate structure to the third gate structure.

6. The semiconductor device of claim 5, wherein gate widths of the first gate structure, the second gate structure, and the third gate structure are the same.

7. The semiconductor device of claim 5,
wherein a gate width of the first gate structure and a gate width of the third gate structure are the same, and
a gate width of the second gate structure is different than the gate width of the first gate structure and the gate width of the third gate structure.

8. The semiconductor device of claim 5, further comprising:
a fourth transistor including a fourth gate structure and arranged adjacent to the third transistor in the first direction;
a third isolation feature extending in the second direction, wherein the third isolation feature is between the third gate structure and the fourth gate structure and in contact with the third gate structure and the fourth gate structure; and
a third connection structure under the third isolation feature, wherein the third connection structure connects the third gate structure to the fourth gate structure.

9. The semiconductor device of claim 8, further comprising:
a first gate contact over and connected to the first gate structure; and
a second gate contact over and connected to the fourth gate structure.

10. The semiconductor device of claim 3, wherein a bottom surface of the first isolation feature is lower than a bottommost semiconductor layer of the first semiconductor layers.

11. The semiconductor device of claim 1, wherein the first isolation feature comprises a first isolation material and a second isolation material over the first isolation material, wherein the first gate structure and the second gate structure partially cover sidewalls of the second isolation material.

12. A semiconductor device, comprising:
a first transistor including first nanostructures over a semiconductor substrate and a first gate structure wrapping around the first nanostructures;
a second transistor including a second gate structure, wherein the second transistor is arranged adjacent to the first transistor in a first direction;
a first isolation feature extending in a second direction perpendicular to the first direction, wherein the first isolation feature is adjacent to the first transistor;
a second isolation feature extending in the second direction and between the first gate structure and the second gate structure;
a first connection structure under the second isolation feature and electrically connecting the first gate structure to the second gate structure; and
an isolation structure under the first isolation feature and the second isolation feature, wherein the first isolation feature contacts the isolation structure and the second isolation feature is separated from the isolation structure by the first connection structure.

13. The semiconductor device of claim 12, wherein a thickness of the first connection structure is in a range from about 10 nanometers to about 20 nanometers.

14. The semiconductor device of claim 12, wherein the first isolation feature and the second isolation feature each comprises:
a first isolation material; and
a second isolation material over the first isolation material, wherein a top surface of the second isolation material is higher than top surfaces of the first gate structure and the second gate structure.

15. The semiconductor device of claim 14, wherein a top surface of the first isolation material and a topmost surface of the first nanostructures are coplanar.

16. The semiconductor device of claim 14, further comprising:
a third transistor including third nanostructures over the semiconductor substrate and a third gate structure wrapping around the third nanostructures, wherein the third transistor is arranged adjacent to the second transistor in the first direction;

a third isolation feature extending in the second direction and between the second gate structure and the third gate structure; and a second connection structure under the third isolation feature and connecting the second gate structure to the third gate structure.

17. The semiconductor device of claim 12, wherein a top surface of the first connection structure is higher than a top surface of the semiconductor substrate.

18. A semiconductor device, comprising:
a first transistor having first nanostructures vertically stacked over a semiconductor substrate and a first gate structure wrapping around the first nanostructures;
a second transistor having second nanostructures vertically stacked over the semiconductor substrate and a second gate structure wrapping around the second nanostructures;
an isolation feature between and in contact with the first gate structure and the second gate structure, wherein a top surface of the isolation feature is higher than top surfaces of the first gate structure and the second gate structure; and
a connection structure in contact with a bottom surface of the isolation feature, wherein the first gate structure is electrically connected to the second gate structure by the connection structure,
wherein a top surface of the connection structure in contact with the isolation feature is lower than bottommost surfaces of the first nanostructures and the second nanostructures.

19. The semiconductor device of claim 18, wherein the top surface of the connection structure in contact with the isolation feature is higher than a top surface of the semiconductor substrate.

20. The semiconductor device of claim 18, wherein the first gate structure, the second gate structure, and the connection structure are formed by an atomic layer deposition process.

* * * * *